(12) United States Patent
Omura et al.

(10) Patent No.: US 7,129,692 B2
(45) Date of Patent: Oct. 31, 2006

(54) CURRENT DETECTION EQUIPMENT AND SEMICONDUCTOR DEVICE

(75) Inventors: Ichiro Omura, Kanagawa (JP); Tomokazu Domon, Kanagawa (JP); Kazuya Kodani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/255,976

(22) Filed: Oct. 24, 2005

(65) Prior Publication Data

US 2006/0038552 A1 Feb. 23, 2006

Related U.S. Application Data

(62) Division of application No. 10/417,180, filed on Apr. 17, 2003, now abandoned.

(30) Foreign Application Priority Data

Apr. 18, 2002 (JP) ............................. 2002-115969

(51) Int. Cl.
*G01R 33/00* (2006.01)
*G01R 1/20* (2006.01)
*H01R 15/18* (2006.01)

(52) U.S. Cl. .................... 324/117 R; 324/126
(58) Field of Classification Search ............... None
See application file for complete search history.

(56) References Cited

U.S. PATENT DOCUMENTS

| | | | |
|---|---|---|---|
| 4,021,729 A | 5/1977 | Hudson, Jr. | |
| 5,049,809 A | 9/1991 | Wakatsuki et al. | |
| 5,831,426 A | 11/1998 | Black et al. | |
| 6,680,608 B1 | 1/2004 | Kojovic | |
| 6,717,397 B1 | 4/2004 | Sorenson, Jr. | |
| 6,819,095 B1 | 11/2004 | Dubhashi et al. | |
| 2004/0095125 A1 | 5/2004 | Jones | |

FOREIGN PATENT DOCUMENTS

JP 2002-40057 2/2002

OTHER PUBLICATIONS

P.R. Palmer, et al., "Measurement of Chip Currents in IGBT Modules", Proc. of EPE '97, Sep. 8, 1997, pp. 406-411, (total 6 pages).
(English translation not available).

*Primary Examiner*—Paresh Patel
(74) *Attorney, Agent, or Firm*—Oblon, Spivak, McClelland, Maier & Neustadt, P.C.

(57) ABSTRACT

A current detection equipment comprises a first coil and a second coil connected in series with the first coil. The current detection equipment is capable of detecting a current flowing through an object which is provided between the first and second coils or provided in a vicinity of the first or second coil. Each of the first and second coils having first conductive patterns provided on a surface of a substrate, a second conductive patterns provided on a back of the substrate and connecting parts which connect the first and second conductive patterns. A semiconductor device including the current detection equipment to measure the current flowing in a semiconductor element is also proposed.

17 Claims, 21 Drawing Sheets

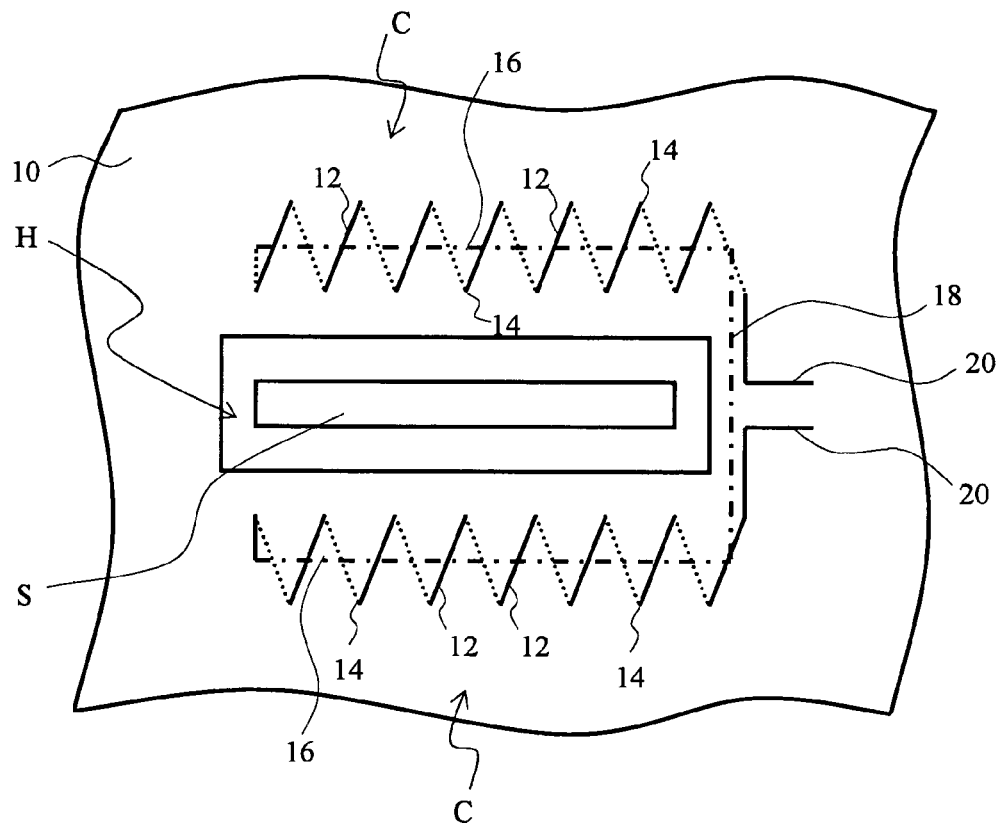
FIG.5
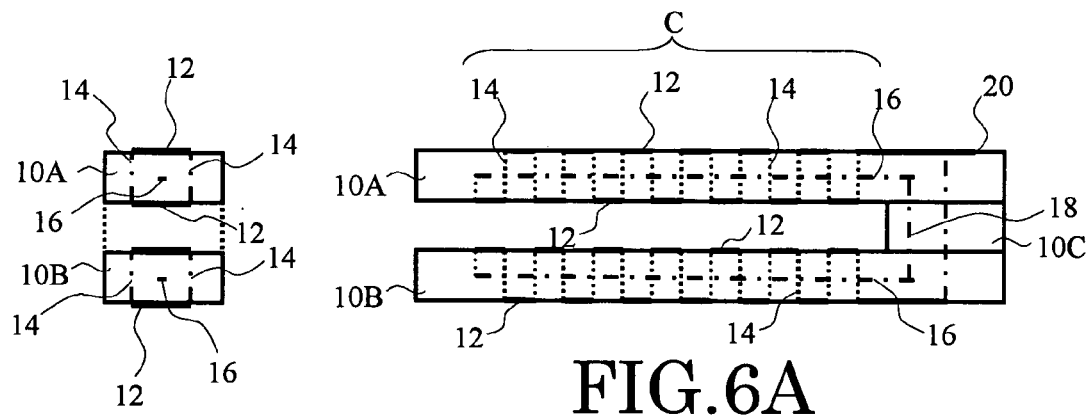
FIG.6A
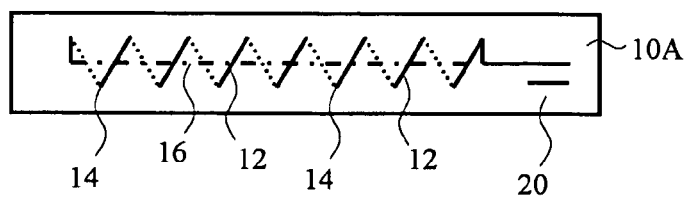
FIG.6B
FIG.6C

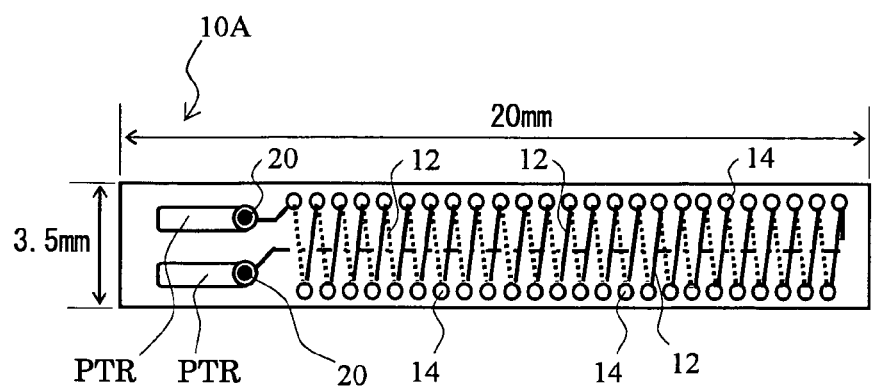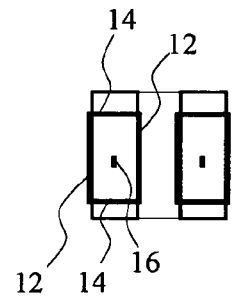
FIG.29A   FIG.29C
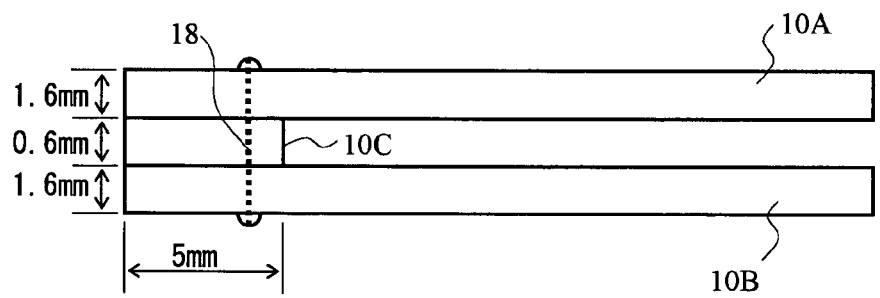
FIG.29B

CURRENT DETECTION EQUIPMENT AND SEMICONDUCTOR DEVICE

CROSS-REFERENCE TO RELATED APPLICATIONS

This application is based upon and claims the benefit of priority from the prior Japanese Patent Application No. 2002-115969, filed on Apr. 18, 2002; the entire contents of which are incorporated herein by reference.

BACKGROUND OF THE INVENTION

The present invention relates to a current detection equipment and a semiconductor device, and more particularly, to a current detection equipment which detects a current flowing through a conductor in a semiconductor device, semiconductor device package or various kinds of electric circuit equipment by a magnetic induction or magnetic field detection, and the semiconductor device using the same.

A current detection equipment for detecting a current from the outside is required in order to measure a current flowing through a lead or a conductor provided in a semiconductor device, or various kinds of electric elements or electric circuits.

For example, the semiconductor device for electric power has evolved into the so-called "module type" with increase in capacity, and the module is becoming larger. However, unevenness of the internal current which originates in parasitic factors, such as an inductance, in a module arises. When the performance of the module is improved, for example by increasing a current capacity or by increasing the operation speed of the module, a destruction of elements in the module may arise owing to the unevenness of the current, and it is becoming a problem.

On the other hand, a current probe cannot be inserted in an inside of the module on the occasion of measurement of the current in a module type semiconductor device. For this reason, unless the internal structure is changed, measurement of current in a module type semiconductor element is practically impossible. On the other hand, if the internal structure of the module is changed in order to provide the conventional measurement equipment such as current transformers, since the inductance itself changes, conditions of measurement also changes and as the results the current to be measured is changed. This leads lower accuracy of measurement. For this reason, a minute current probe for measuring without changing the electrode structure inside a module etc. is being needed.

Conventionally, for detection of a short circuit or for feedback on gate voltage, the current is measured by using an element with a current sensor or by using a current probe called "CT (Current Transformer: current transformer)" etc.

The element with a current sensor has been developed in IGBT (Insulated Gate Bipolar Transistor). This IGBT chip has the structure where the emitter is divided into a divided emitter and a main emitter. In the case of this element, in the state where gate is ON, the current which is flowing through the main element can be estimated by detecting the voltage decrease at the resistance which is inserted between the divided emitter and the main emitter.

However, in this system, since a current sensing part is made as a part of the chip of IGBT, there are the following problems:

(1) Chip structure becomes complicated.

(2) The effective area of the chip becomes smaller.

(3) The output of the voltage decrease from the emitter resistance in the IGBT varies.

(4) The linearity between the current which actually flows, and an output is low.

(5) The output is not insulated.

Chip cost increases as a result of the above (1). The current which can be passed becomes smaller as a result of (2). Measurement accuracy falls as a result of (3). The design of a detection circuit becomes difficult and complicated as a result of (4). Insulating device such as a photocoupler is required in order to insulate the output as a result of (5). Consequently, the output becomes binary ("1" and "0"), and analog values, such as a current value, cannot be fed back to the control side.

On the other hand, CT convergence the current magnetic flux generated around a conductor with a magnetic core, and detects the current as an electromagnetic induction current produced in a coil. However, the magnetic core has the following problems:

(1) In order to prevent the magnetic saturation in a large current condition, CT is enlarged.

(2) The inductance of the main circuit increases in accordance with the form of the core. As a result, current will increase by forming a current path different form original one when a large core of CT is inserted in the circuit.

Because of these problems, when CT is installed in a small semiconductor device, it is difficult to detect current correctly without affecting the operation of the semiconductor device.

As explained above, it was difficult to measure current correctly and easily, without affecting the operation in insides, of devices, such as a semiconductor device, with the conventional technology.

SUMMARY OF THE INVENTION

According to an embodiment of the present invention, there is provided a current detection equipment comprising: a first coil; and a second coil connected in series with the first coil, the current detection equipment being capable of detecting a current flowing through an object which is provided between the first and second coils or provided in a vicinity of the first or second coil, and each of the first and second coils having first conductive patterns provided on a surface of a substrate, a second conductive patterns provided on a back of the substrate and connecting parts which connect the first and second conductive patterns.

According to other embodiment of the invention, there is provided a current detection equipment comprising: a substrate having a notch or a hole; and a first and a second coils provided on opposite sides of the notch or the hole, each of the first and second coils having first conductive patterns provided on a surface of the substrate, a second conductive patterns provided on a back of the substrate and connecting parts which connect the first and second conductive patterns.

According to other embodiment of the invention, there is provided a current detection equipment comprising: a first substrate having a first coil; a second substrate having a second coil; and a spacer provided between the first and second substrates, the first coil having first conductive patterns provided on a surface of the first substrate, a second conductive patterns provided on a back of the first substrate and connecting parts which connect the first and second conductive patterns, the second coil having first conductive patterns provided on a surface of the second substrate, a second conductive patterns provided on a back of the second substrate and connecting parts which connect the first and second conductive patterns.

According to other embodiment of the invention, there is provided a semiconductor device comprising: a semiconductor element; and a current detection equipment including a substrate having a notch or a hole; and a first and a second coils provided on opposite sides of the notch or the hole, each of the first and second coils having first conductive patterns provided on a surface of the substrate, a second conductive patterns provided on a back of the substrate and connecting parts which connect the first and second conductive patterns, and at least a part of a current flowing in the semiconductor element being detected by the current detection equipment.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIG. 1A is a plan view, FIG. 1B is a front view, and FIG. 1C is a left-hand side view thereof;

FIG. 5 shows an example where the hole H having a shape, such as a slit, is formed in the substrate 10, and the coil parts C can be formed at the both sides of the hole H;

FIGS. 6A through 6C are schematic diagrams illustrating another example of the current detection equipment of the present invention;

FIG. 26A is a plan view and FIG. 26B is a side view of the analysis model;

FIGS. 29A through 29C are schematic diagrams showing the more concrete structure of the probe part P;

FIG. 29A shows a plan view of the probe part, FIG. 29B shows a front view thereof, and FIG. 29C shows a side view thereof;

DETAILED DESCRIPTION

Referring to the accompanying drawings, embodiments of the present invention will now be described in detail.

Figures 1A, 1C:
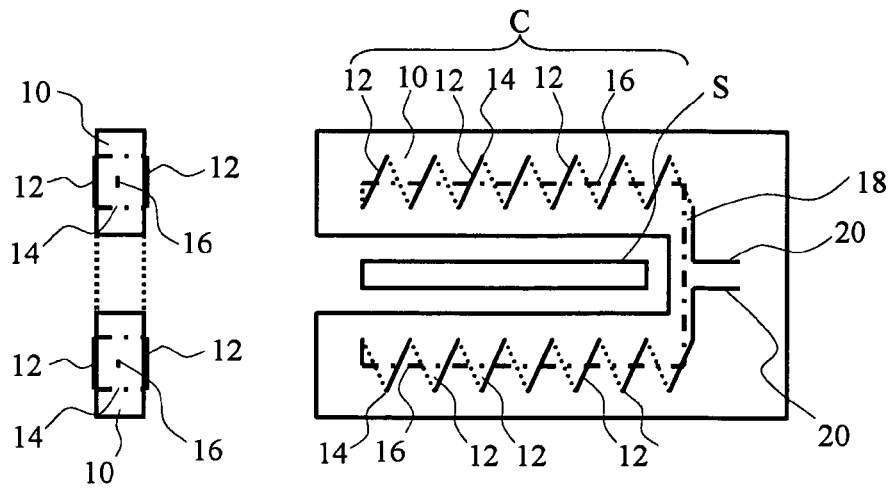
FIGS. 1A through 1C are schematic diagrams illustrating the probe part of the current detection equipment concerning the embodiment of the present invention, where
Figure 1B:
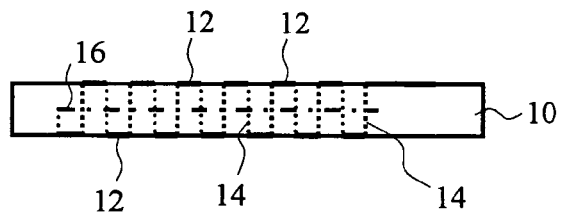

FIGS. 1A through 1C are schematic diagrams illustrating the probe part of the current detection equipment concerning the embodiment of the present invention. That is, FIG. 1A is a plan view, FIG. 1B is a front view, and FIG. 1C is a left-hand side view thereof.

In the case of this example, the pattern 12 which consists of an electric conductor is formed in the surface and the back of a substrate 10. As a material of the substrate 10, an insulating material or semi-insulating material such as resin, ceramic as silicon can be used as will be explained in full detail later. The pattern 12 can be formed by various kinds of metals including copper (Cu), aluminum (Al), and gold (Au), and by other conductive materials.

And as for these patterns 12, the surface side and the back side of the substrate 10 are connected by the through holes 14 which penetrate the substrate 10. Here, in order to connect the patterns between the different layers of the substrate 10, through holes 14 have a structure where the inside of the hole which penetrates a substrate 10 is filled up with a conductor.

Thus, a pair of coil parts C are formed by the patterns 12 formed on both sides of the substrate 10 and the through holes 14 which connect these patterns.

Moreover, a substrate 10 has the return wiring 16 inside, which is constituted by an electric conduction layer. By providing this return wiring 16, one side of the probe needs not have any conduction pattern, thus an opening can be formed for inserting current conduction material to be measured. This return wiring 16 passes along near the center of each of coil parts, and reaches near the end of the coil part C. This arrangement (providing the wiring 16 at the center of coil) is designed to minimize influence other magnetic field etc. And this return wiring 16 is connected to the joint wiring 18 for connecting the pair of coil parts in series.

Thus, the both ends of the pair of coil parts C connected in series are connected to the output extraction terminal 20 provided on the same side as the joint wiring 18. A resistance which is not illustrated is connected to the both ends of these extraction terminals 20 in parallel as will be explained in full detail later.

In the case of the example shown in FIG. 1, the coil part C is formed on the substrate 10 which has the plane form of a horseshoe. That is, each of the patterns 12 is formed at a predetermined angle to the center axis of the coil part C, and the through holes 14 are formed at the both ends of the patterns 12. The patterns 12 are formed at the almost same angle to the center axis of the coil part C in both of front and back sides of the substrate 10, and patterns 12 on the surface and the back of the substrate 10 are connected electrically by the through holes 14.

Instead of the through holes 14, the pattern of an electrically conductive material may be formed on the side surfaces of the substrate 10 in order to connect the patterns 12 of the front surface and the back surface of the substrate 10, as will be explained in full detail later.

A conductor S to be measured is inserted between the pair of coil parts C on the substrate which has a planar shape of a horseshoe. The cross-sectional form of the conductor S is not limited to the specific example shown in FIG. 1, but any conductor which is able to be inserted between the pair of coil parts C may be measured.

Figures 2A, 2B:
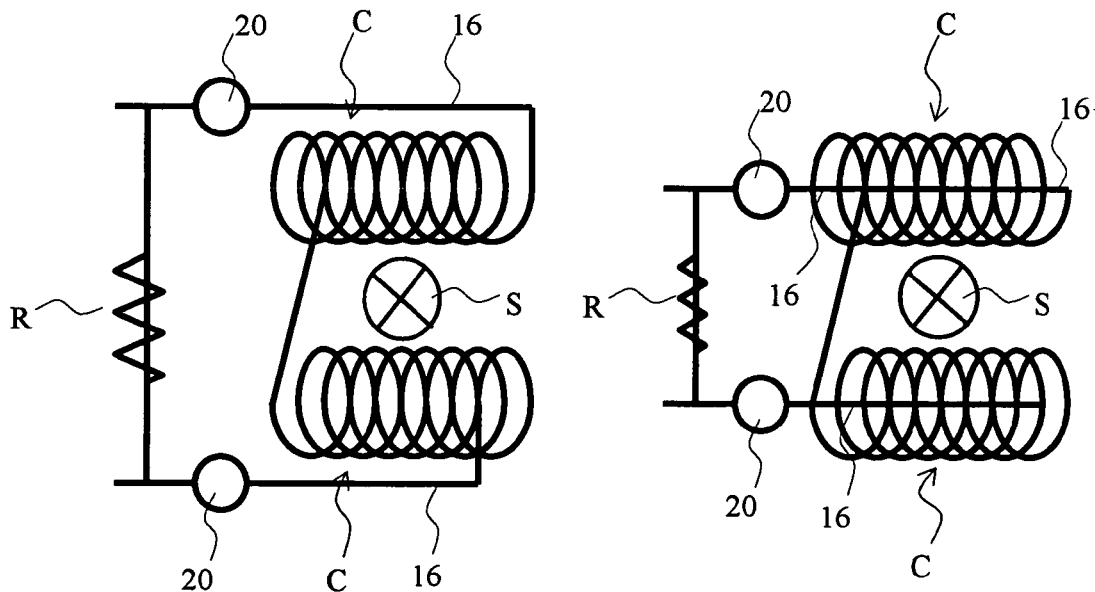
FIGS. 2A and 2B are schematic diagrams illustrating the connection relations of the pair of coil parts C.

FIG. 2 is a schematic diagram illustrating the connection relation of the pair of coil parts C. That is, the two coil parts C are connected in series, and the conductor S is inserted in the portion sandwiched between the coil parts C. As expressed in FIG. 2A, the return wiring 16 may be formed outside of the coil part C, or as expressed in FIG. 2B, it may be formed inside of the coil part C. In order to ensure the noise-proof nature to a noise caused by an external stray magnetic field etc., it is desirable to provide the wiring 16 inside the coil as shown in FIG. 2B. On the other hand, it is more advantageous to form the return wirings 16 outside of the coils in respect of the easiness of manufacture, as illustrated in FIG. 2A.

As shown in FIGS. 2A and 2B, the pair of coil parts C which are connected in series produce a voltage between the extraction terminals 20 at their both ends in response to a change of the magnetic field generated by a current which flows through the conductor S to be measured. This voltage can be measured between the both ends of the resistance R which is connected to the extraction terminals 20.

Figure 3:
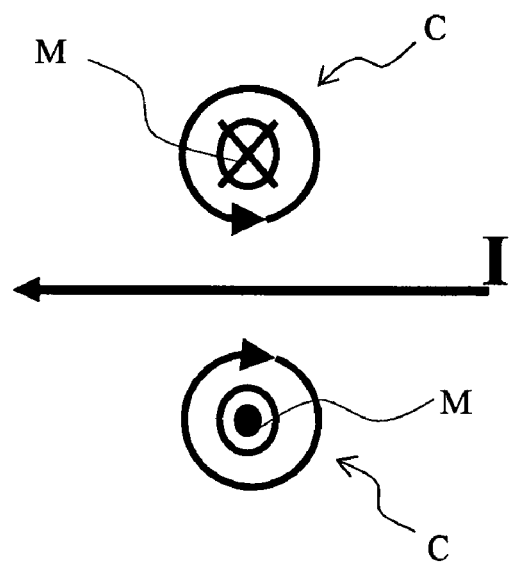
FIG. 3 is a schematic diagram showing the electromagnetic induction action produced in the coil parts C.

FIG. 3 is a schematic diagram showing the electromagnetic induction action produced in the coil parts C. That is, a magnetic field M is formed by the current I which flows through the conductor S to be measured. By this magnetic field M, the voltage of the direction expressed with the arrow is generated in the coil parts C. By measuring that voltage between the both ends of the resistance which is connected in parallel with the coils, the differentiation of the current I which flows through the conductor S can be obtained. By using an integration circuit, for example, this differentiation can be reconstructed into an original waveform of the current I. Alternatively, control of a semiconductor element or a circuit can also be performed, by using the differentiation of the current as it is.

Here, the largest output will be obtained, if it is arranged so that the current I which flows through the conductor S becomes almost perpendicular to a plane which includes the center axes of two coil parts C. Moreover, since the strong current magnetic field formed near the conductor S can be picked up if the spacing between two coil parts C is made as narrow as possible, a large output can be obtained.

$\Delta T$ of the differentiation $\Delta I/\Delta T$ obtained in the detection equipment is determined by the time constant of the resistance R which is connected to the coil parts C, and by the time constant of the inductance L of the coil parts C. Therefore, if inductance L is large, an output will become large, and an output will become small if Resistance R is small. Here, the value of Resistance R and the value of the inductance L of the coils are determined by a time constant which is needed for the system, and by a size and a number of turns of the coil parts C, etc.

Therefore, when the responsibility is important, what is necessary is just to use a smaller coil and smaller resistance to while making some outputs into a sacrifice. On the contrary, when a large output is required, what is necessary is just to use a large coil and a large resistance.

Moreover, as illustrated in FIGS. 1A through 2B, the winding directions of the coil parts C are made so that the induction voltage generated at each coil becomes in the same direction. That is, it is formed so that the induction voltage produced by the current of the conductor S in one coil part C and the induction voltage produced by the current of the conductor S in the coil part C of another side may be added. Thus, the induction voltage produced in each coil part C by the current which flows through the conductor S can be doubled and easily detected.

Furthermore, when an external magnetic field is applied to the pair of coil parts, induction voltage is generated in an opposite direction in each coil part C. Therefore, the influence of an external magnetic field can be canceled, by connecting the coil parts C in series. That is, the measurement error resulting from an external magnetic field can be suppressed.

Figure 4:
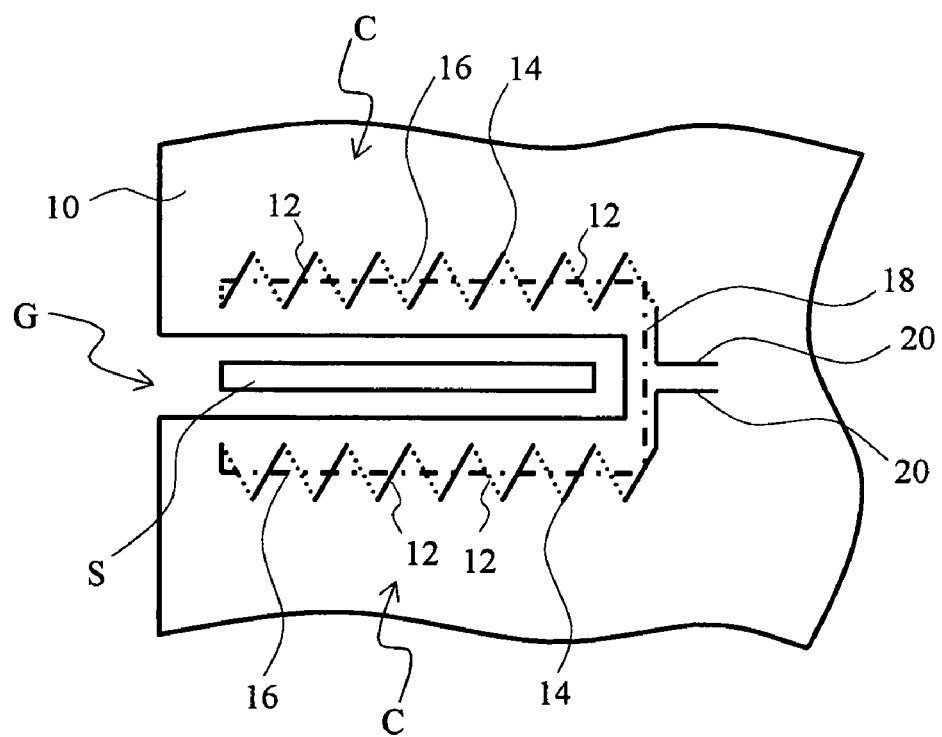
FIG. 4 is a schematic diagram illustrating other examples of the current detection equipment of the present invention.

FIG. 4 is a schematic diagram illustrating other examples of the current detection equipment of the present invention. That is, in the case of this example, slit-like notch G is prepared in the end of a substrate 10 on which an electric circuit etc. is formed, and the coil parts C are formed in the both sides of the notch G. The current which flows through a conductor S can be measured by inserting the conductor S in the notch G. Here, the form of notch G is not limited in the shape of a slit. It may be semicircular or square, for example, and may suitably be determined according to the cross-sectional form and the size of the conductor S to be measured.

In the case of this example, circuits, such as an integration measurement circuit, a gate circuit, a control circuit, and an electric power main circuit, which are not illustrated, may also be formed on the substrate 10. These circuits can be connected with the extraction terminals 20 of the coil parts C directly. Moreover, when an electric power main circuit is formed on a printed circuit board and the object S to be measured is patterned, the coils C and the object S can be formed on the same substrate by using a patterning technique, and thus, the fabrication cost can be lowered compared with the case where the coils are formed separately.

On the other hand, as illustrated in FIG. 5, the hole H having a shape, such as a slit, maybe formed in the substrate 10, and the coil parts C can be formed at the both sides of the hole H. Then the current which flows through the conductor S which penetrates the hole H can be measured. In this example, the shape of the hole H is not limited to a slit. The form of the hole H can determined suitably according to the cross-sectional form and the size of the conductor S to be measured.

FIGS. 6A through 6C are schematic diagrams illustrating another example of the current detection equipment of the present invention.

In the case of this example, the probe is formed by laminating two or more substrates. That is, substrate 10A in which the first coil part C is formed, and substrate 10B in which the second coil part C is formed are stuck through the spacer 10C. And the conductor S to be measured is inserted in the gap between the substrates 10A and 10B. Although the case where spacer 10C is prepared only in one end side of a probe is shown in FIGS. 6A through 6C, the spacer may be prepared in the both sides of the probe part P, respectively. In this case, the object S to be measured is inserted in the opening formed between the substrates 10A and 10B.

In the case of this example, the coil parts C can fully be brought close to the conductor S to be measured. As a result, the current magnetic field of a high density formed near the conductor S can be picked up, and an output increases. Furthermore, the external magnetic fields which the coil parts C receive respectively can be made almost the same by making two coil parts approach. As a result, it becomes possible to make the detection equipment less susceptible to the magnetic noises (for example, stray magnetic field which the current of other wiring which is not illustrated forms) from the circumference.

Figure 7:
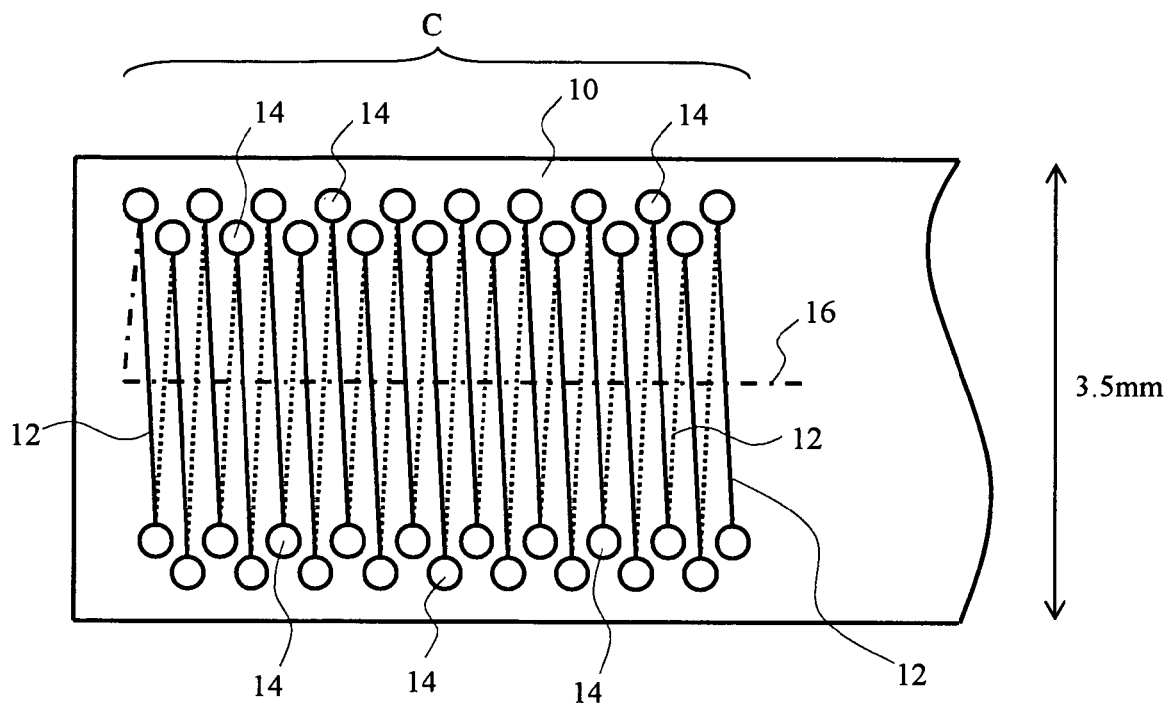
FIG. 7 is a schematic diagram showing the example of the coil part C in the present invention.

FIG. 7 is a schematic diagram showing the example of the coil part C in the present invention. That is, two or more substantially parallel patterns 12 are formed on the surface of a substrate 10, and two or more substantially parallel patterns 12 are formed on the back side of the substrate 10. And these patterns 12 of the surface and the back sides are connected by the through holes 14 and form a continuous coil part C.

If the interval of the patterns 12 is narrowed and the number of patterns 12 is increased, the number of turns of the coil part C can be increased, and thus, the output of current detection can be reinforced. For this purpose, it is good to arrange the adjoining through holes 14 alternately as shown in the figure. That is, if an actual formation process is taken into consideration, the diameter of the through hole 14 will become larger rather than the width of the patterns 12 in many cases. Therefore, by arranging the through holes 14 alternately, the interval of the adjoining patterns 12 can be narrowed and formation density can be made higher.

Figure 8:
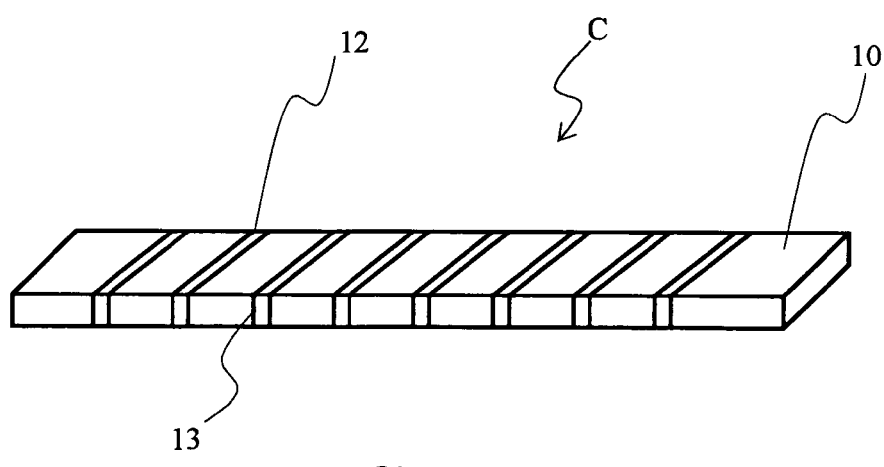
FIG. 8 is a schematic diagram showing another example of the coil part C in the present invention.

FIG. 8 is a schematic diagram showing another example of the coil part C in the present invention. That is, in this example, the patterns 13 are formed on the sides of the substrate 10, and the patterns 12 on the front side and the back side of the substrate 10 are connected by these patterns 13. Thus, it becomes easy to form the patterns 12 by high density by using the patterns 13 of the sides instead of the through holes 14.

Figure 9A:
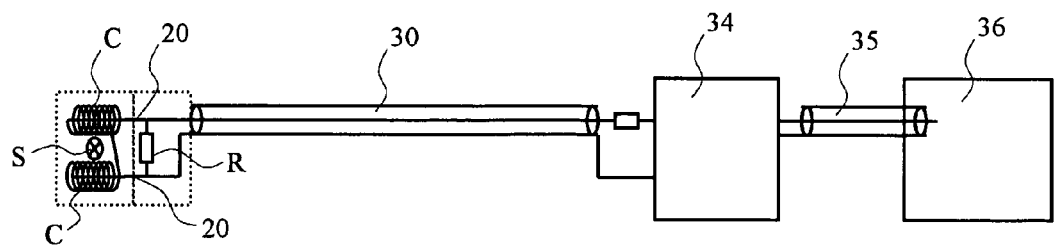
FIGS. 9A and 9B are schematic diagrams illustrating the measurement systems which use the current detection equipment of the present invention.
Figure 9B:
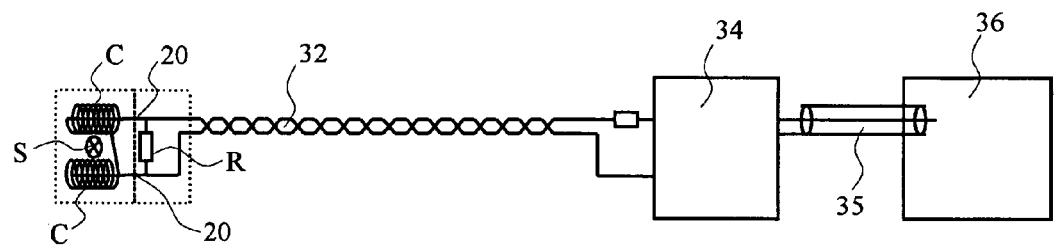

FIGS. 9A and 9B are schematic diagrams illustrating the measurement systems which use the current detection equipment of the present invention. That is, in the case of the example illustrated in FIG. 9A, the signal from the extraction terminals 20 of the coil parts C is inputted into the integration circuit 34 through the coaxial wiring 30, and the waveform of the current flowing through the conductor S is reconstructed by an integration processing performed by the integration circuit 34. This waveform can be observed through the coaxial wiring 35 with measuring instruments, such as an oscilloscope 36, for example.

Alternatively, as illustrated in FIG. 9B, the signal from the extraction terminals 20 of the coil parts C can be inputted into the integration circuit through the twist pair wiring 32.

Figure 10:
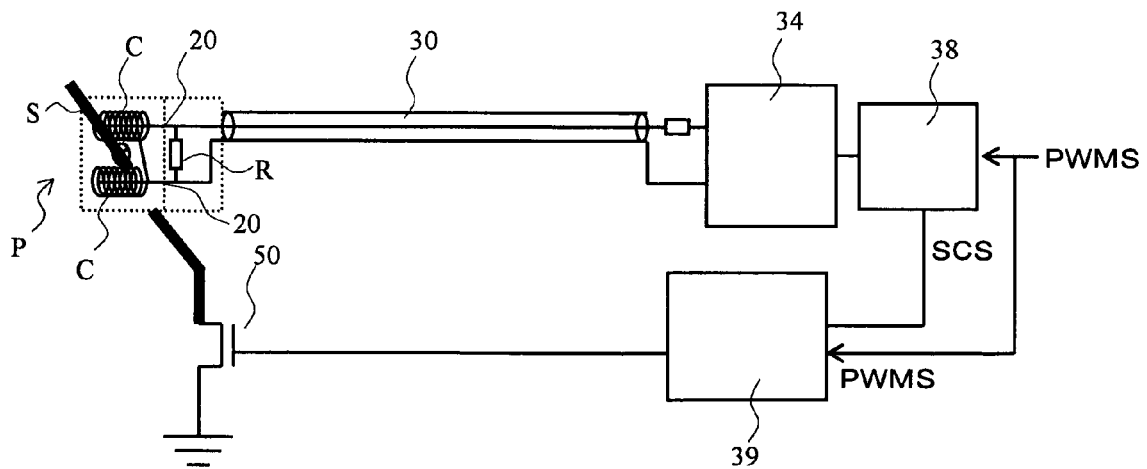
FIG. 10 is a schematic diagram showing the principal part of the semiconductor device which includes the current detection equipment of the, present invention.

FIG. 10 is a schematic diagram showing the principal part of the semiconductor device which includes the current detection equipment of the present invention. This semiconductor device has a semiconductor element 50 for electric power control or switching such as a Power MOSFET and an IGBT.

The gate control circuit which is not illustrated is provided in the inside or the exterior of this semiconductor device, and a pulse width modulation signal (PWMS) is supplied therefrom. This PWM signal (PWMS) is inputted into the drive circuit 39, and the gate of the semiconductor element 50 is driven by the output of the drive circuit 39 to perform control or switching of an electric power.

The current which flows through the conductor S connected to the main electrode (an emitter, a collector, a source, or a drain) of the semiconductor element 50 is detected by the probe part P of the current detection equipment of the invention. And the voltage measured at the both ends of the resistance R connected to the extraction terminals 20 of the probe part P is reconstructed into a current waveform in the integration circuit 34 through the coaxial wiring 30.

The obtained current waveform data is compared with a predetermined restriction current value in the comparison circuit 38. The comparison circuit 38 may be equipped with the offset cancellation circuit for compensating the offset included in the inputted current waveform data. Thus, it becomes possible to adjust the offset of the integration circuit when the semiconductor element is in the state of OFF.

The comparison circuit 38 outputs the short circuit signal (SCS) in order to indicate that the semiconductor element 50 is short-circuited, when the current data outputted from the integration circuit 34 exceeds a predetermined restriction current value. If this short circuit signal (SCS) is received, the drive circuit 39 will output an interception gate signal prepared for the case of a short circuit in order to turn OFF (off) the gate of the semiconductor element 50, and to intercept the current.

As explained above, in the case of this example, the monitor of the output current of a semiconductor device 50 is made with a current sensing device, and if a short circuit state is generated, the current may be intercepted immediately. By using the current detection equipment of the invention, it becomes possible to monitor the output current correctly without affecting operation of the semiconductor element 50, and the size of the whole semiconductor device can be kept compact. The measurement point of the current by the probe P may not be limited to a collector side, but may be measured at an emitter side, and may be measured at both points.

Figure 11:
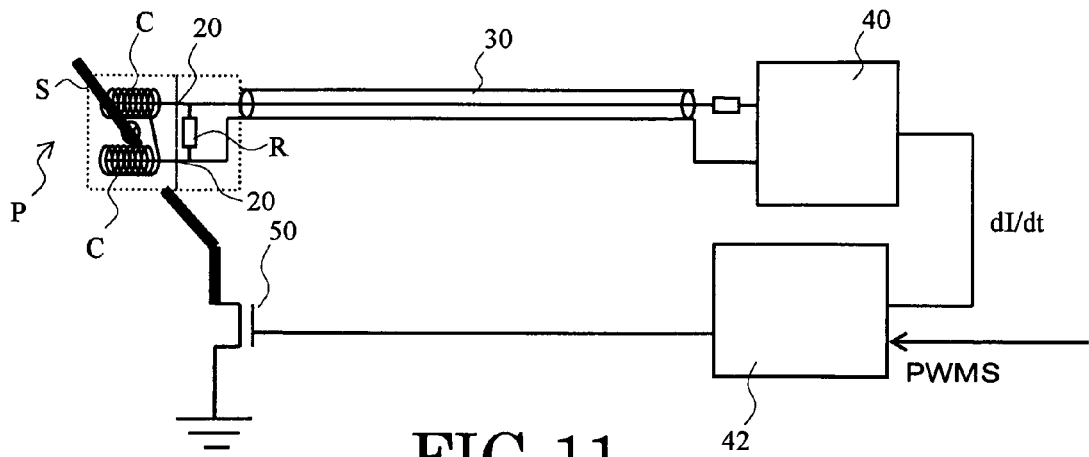
FIG. 11 is a schematic diagram illustrating the principal part of another semiconductor device which includes the current detection equipment of the present invention.

FIG. 11 is a schematic diagram illustrating the principal part of another semiconductor device which includes the current detection equipment of the present invention. This semiconductor device also has a semiconductor element 50 for electric power control or switching such as a Power MOSFET and an IGBT.

Also in this semiconductor device, the probe part P which measures the output current of the semiconductor element 50 is provided. And the current differentiation value outputted from the probe part P is amplified in the amplification circuit 40, and is inputted into the drive circuit 42 with a PWM signal.

Based on the current differentiation signal (dI/dt) inputted from the amplification circuit 40, the short circuit of the semiconductor element 50 is detected, or the drive circuit 42 judges the deviation of the output current from the semiconductor element 50. And the gate control signal optimized based on these judgment results is given to the gate of the semiconductor element 50.

Figure 12:
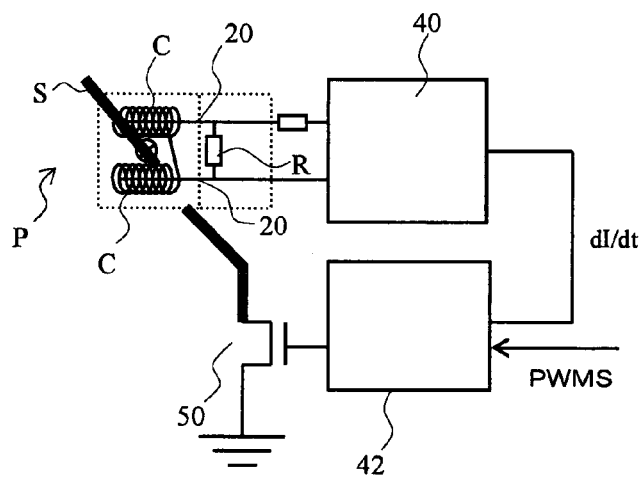
FIGS. 12 and 13 show the examples where the circuits (34, 40, 42) are prepared near the probe part P, and the signal is inputted directly.

In the examples expressed in FIGS. 10 and 11, the output signal from the probe part P of current detection equipment is inputted into the integration circuit 34 or the amplification circuit 40 through the coaxial wiring 30. On the other hand, as expressed in FIGS. 12 and 13, these circuits may be prepared near the probe part P, and the signal may be inputted directly. In these cases, these circuits may be connected with the coil part C with substrate wiring by forming the circuits on the substrate 10 in which the coil part C is formed.

Figure 13:
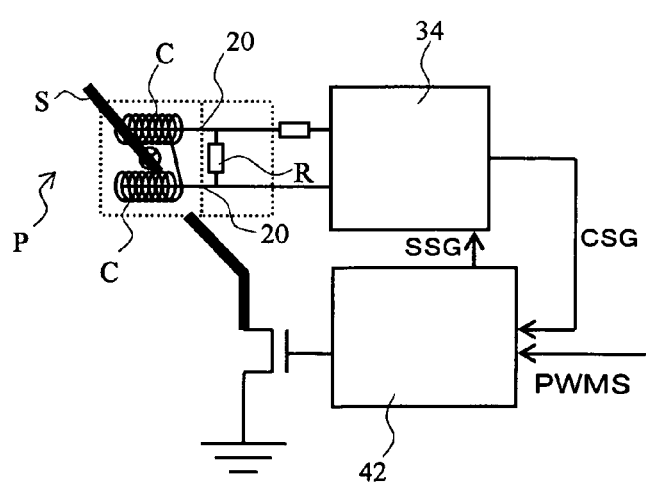

Moreover, as shown in FIG. 13, a status signal (SSG) indicating the state of the gate of the semiconductor element 50 may be inputted from the drive circuit 42 to the integration circuit 34, and the integration circuit 34 may supply a current signal (CSG) to the drive circuit 42 while taking the status signal into consideration.

Figure 14A:
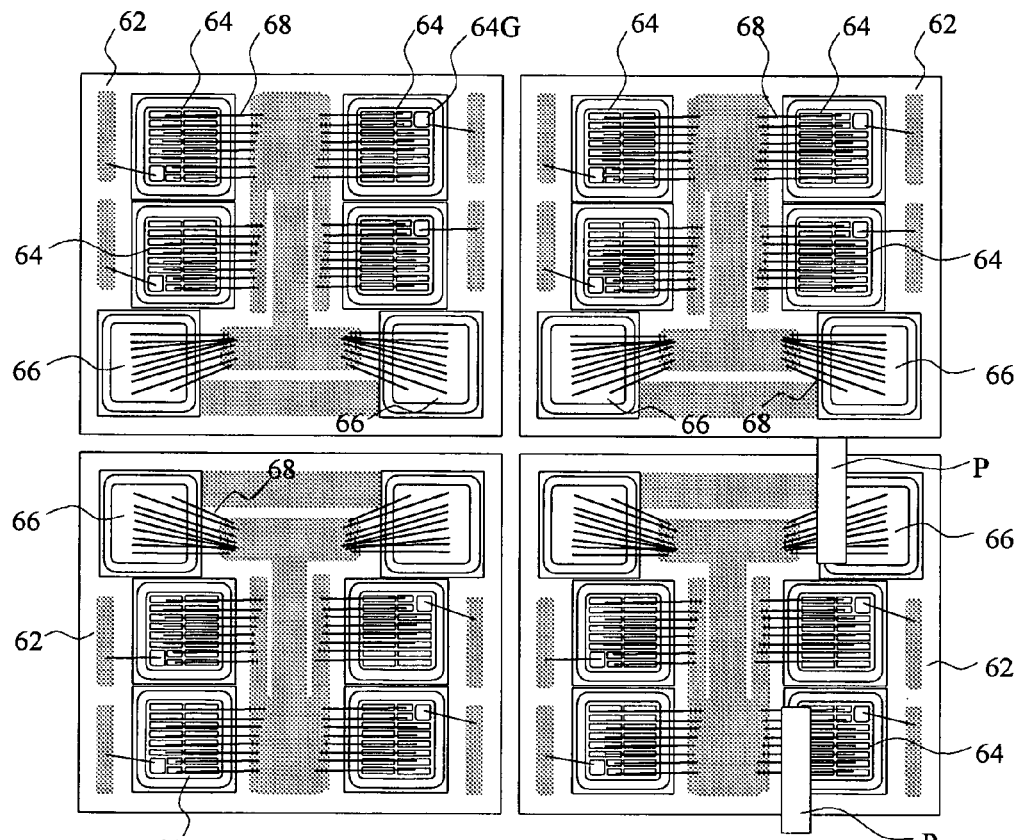
FIGS. 14A and 14B are schematic diagrams showing the example of the semiconductor device which, includes the current detection equipment of the present invention.
Figure 14B:
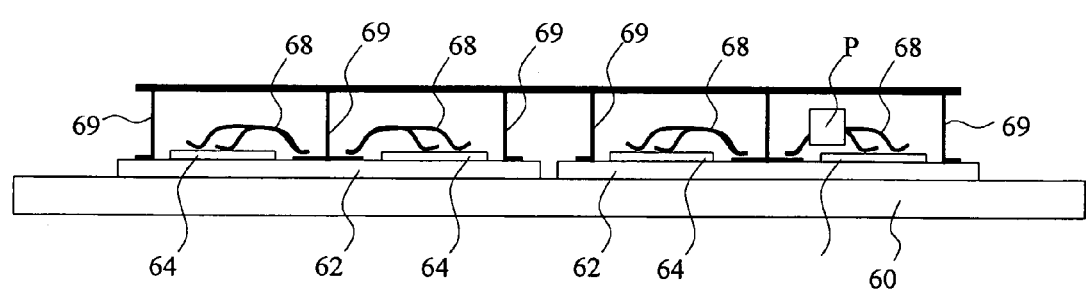

FIGS. 14A and 14B are schematic diagrams showing the example of the semiconductor device which includes the current detection equipment of the present invention. That is, the semiconductor device expressed in these figures is a module for electric power control. FIG. 14A is an internal plane view, and FIG. 14B is a side view.

This module has four DBC (Direct Bonded Cupper) substrates 62 provided on the heat dissipation substrate 60 which consist of copper (Cu). The DBC substrates 62 have a structure where the thin film pattern which consists of copper is formed on the surface of a ceramic substrate. On the copper pattern, IGBTs 64 and the freewheeling diodes 66 are mounted.

Figure 15:
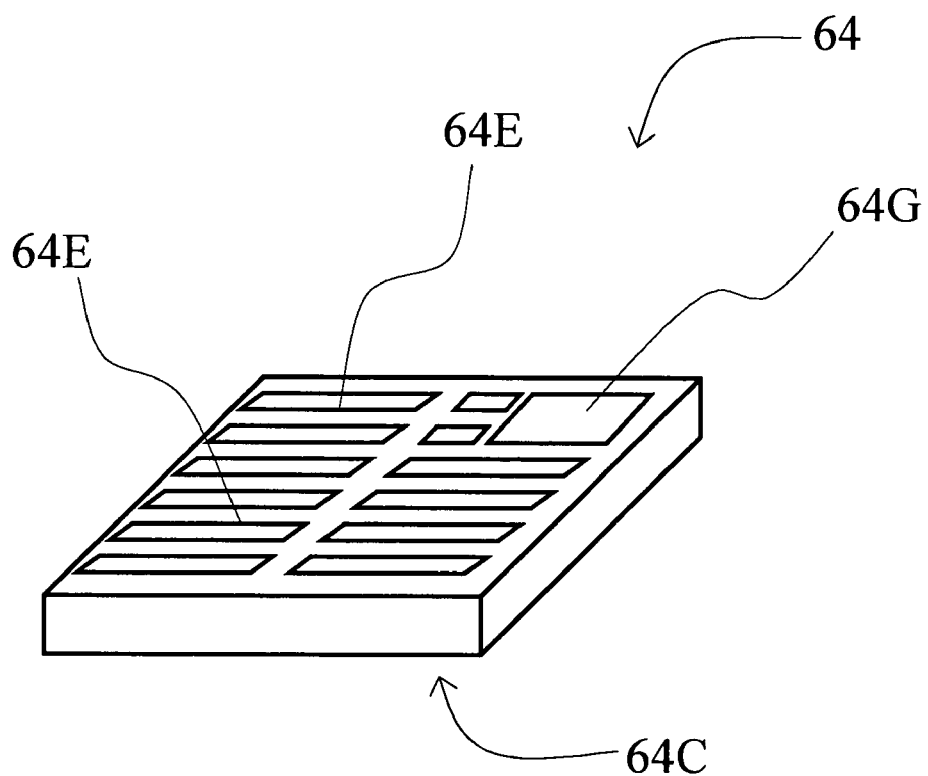
FIG. 15 shows an outline of the IGBT 64.

As expressed in FIG. 15, IGBT 64 has a gate electrode 64G and two or more emitter electrodes 64E on the surface side, and has a collector electrode 64C on the back side.

Gate electrode 64G and emitter electrodes 64E are connected to the copper pattern on the DBC substrate 62 by the bonding wire 68, respectively. Collector electrode 64C is directly connected to the copper pattern on which IGBT 64 is mounted.

Similarly, as for the free wheeling diode 66, the electrode on the side of the surface is connected to the copper pattern of the DBC substrate 62 by the bonding wires 68. On the other hand, the electrode on the back side is directly connected to the copper pattern on which the diode 66 is mounted.

And each of these electrodes is suitably connected to the external circuit or external apparatus (not shown) through the pullout wires 69.

Figure 16:
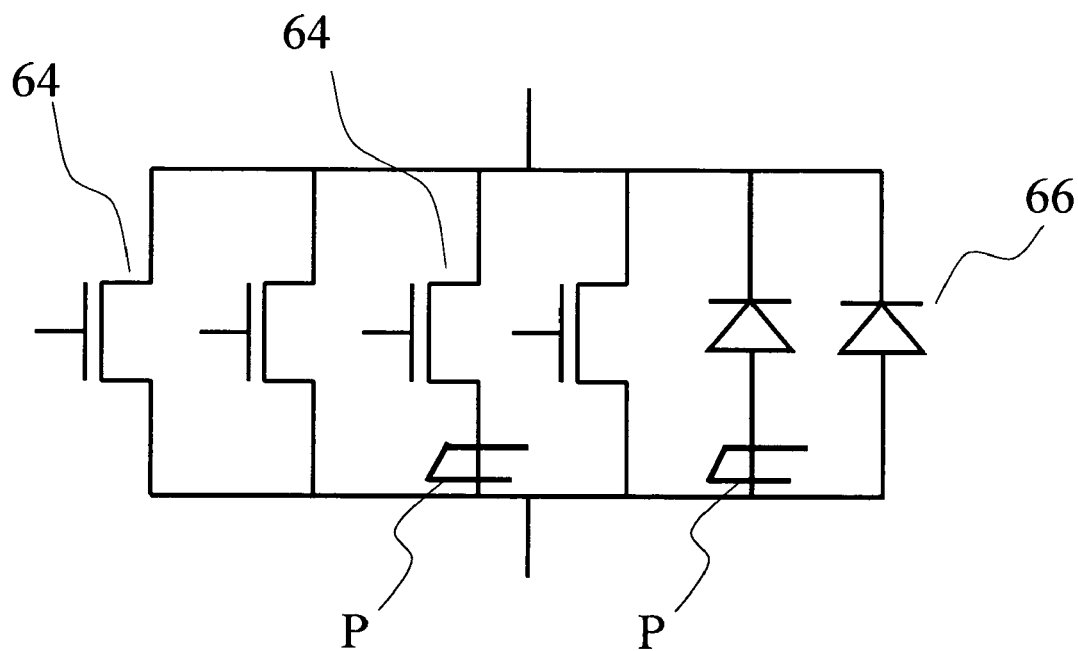
FIG. 16 is a diagram of an equivalent circuit of this module for electric power control.

FIG. 16 is a diagram of an equivalent circuit of this module for electric power control. That is, this figure expresses the circuit on one DBC substrate 62, and shows that a parallel connection of four IGBTs 64 and the two free wheeling diodes 66 is made.

And in the present invention, measurement of the current is enabled by, for example, placing the probe part P at the bonding wire 68 connected to emitter electrode 64E of IGBT 64, and at the bonding wire 68 connected to the free wheeling diode 66. However, measurement of the current maybe performed only at the IGBT 64, or only at the diode 66. Instead, measurement of the current may be performed not only in one element but in two or more elements. Furthermore, measurement may be performed in any portion of the main electrode wiring in the module, for example, measurement can be performed at the collector or emitter wire frame inside or outside of the package.

Figure 17:
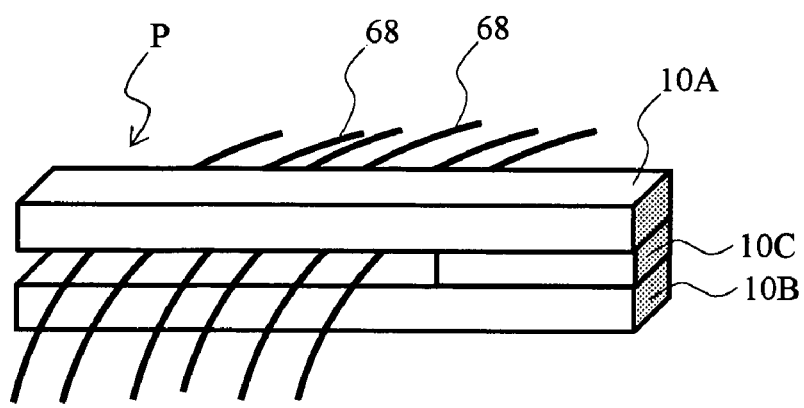
FIG. 17 is an enlarged perspective diagram showing a principal part of the probe part.

FIG. 17 is an enlarged perspective diagram showing a principal part of the probe part. This probe part P has a structure which is illustrated in FIGS. 6A through 6C. By inserting two or more bonding wires 68 in the gap of the pair of coil parts C, the current which flows through the wire 68 can be detected. Bonding wire and the coil center line may preferably be perpendicular to each other.

As mentioned above, in the semiconductor device expressed in FIGS. 14A through 17, the current which flows IGBT 64 and the free wheeling diode 66 can be measured in real time. For example, urgent interception at the time of a short circuit which was mentioned above about FIGS. 10 through 13, feedback to the gate control based on the measured current data, etc. can be performed certainly and easily.

According to the invention, the current can be measured without affecting the operation of IGBT 64 or the free wheeling diode 66. Besides, since the probe part P can be formed compactly, it is not necessary to enlarge modular size to add the measurement system.

As a result, a highly reliable, highly efficient and compact semiconductor devices, such as a module for electric power control, can be offered.

Although the examples of the semiconductor devices which include the current detection equipment of the invention have been explained in the above, the invention is not limited to these specific examples. For example, the invention is applicable similarly to MOSFET, a thyristor, GTO, a diode, etc. besides IGBT.

Figure 18:
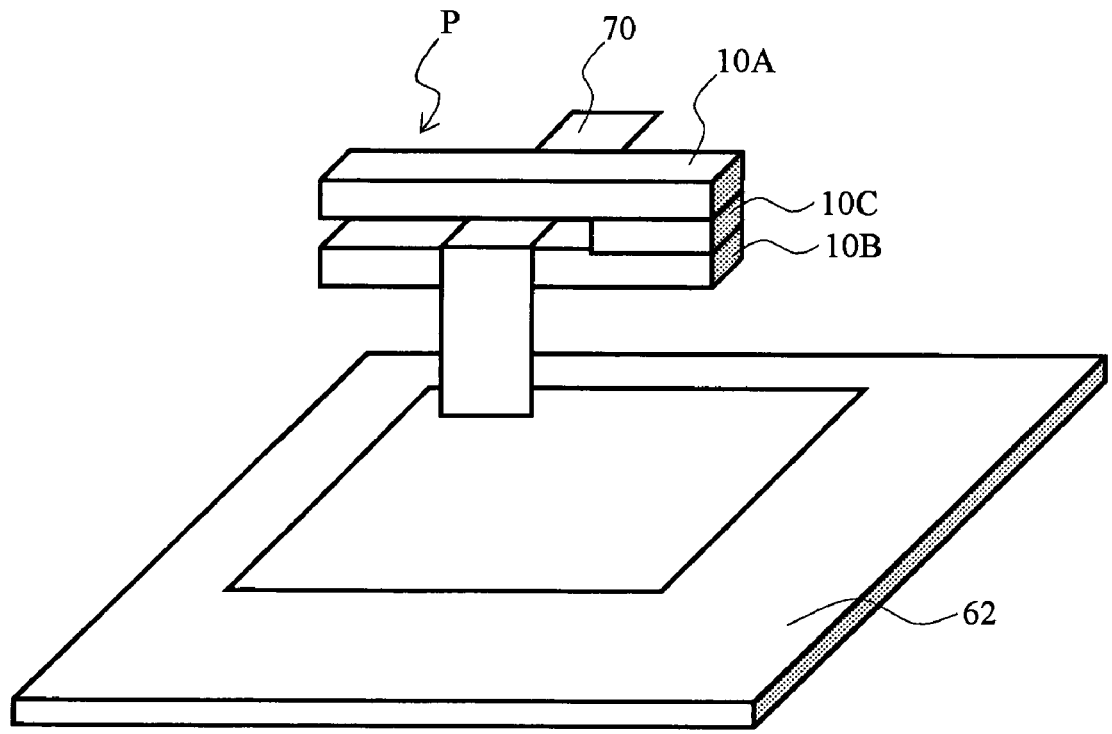
FIG. 18 is a schematic diagram showing the example of the arrangement of the probe part P.

FIG. 18 is a schematic diagram showing the example of the arrangement of the probe part P. That is, when taking out current from the pattern of the DBC substrate 62 through the pullout wire 70 (it is also called "bus" or a "stub" wire frame etc.), such as a copper plate, the probe part P can be placed at this pullout wire 70, and current can also be measured.

Figure 19:
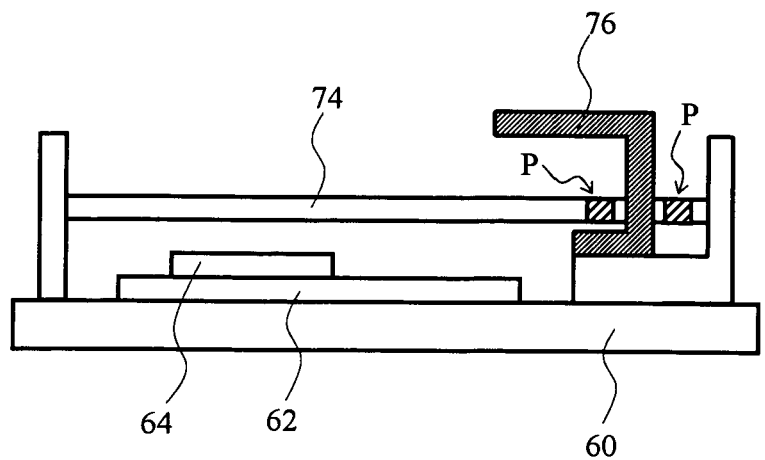
FIG. 19 shows the structure where the probe part P is formed in a gate substrate.

Moreover, as illustrated in FIG. 19, this probe part P may be formed in a gate substrate. That is, in the case of the example expressed in this figure, the DBC substrate 62 is formed on the copper substrate 60, and IGBT 64 is mounted on it.

And the gate substrate (printed circuit board) 74 is further formed with a predetermined spacing above the IGBT 64. This gate substrate 74 has the drive circuit which outputs the signal which controls the gate of IGBT 64. On the other hand, with the pullout electrode 76, the main electrode (a collector or emitter) of IGBT 64 penetrates the gate substrate 74, and is taken out above the module.

And if the probe part P of the current detection equipment of the invention is placed so as to sandwich the pullout electrode 76 at the gate substrate 74, the main electrode current can be measured.

Figure 20A:
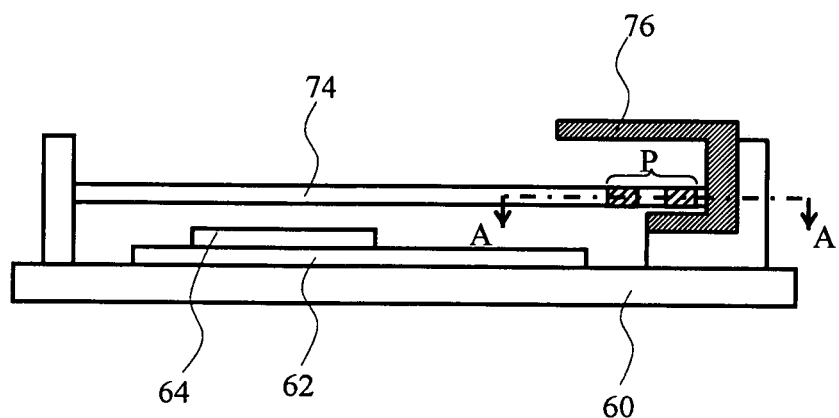
FIG. 20A shows a longitudinal section of the module.
Figure 20B:
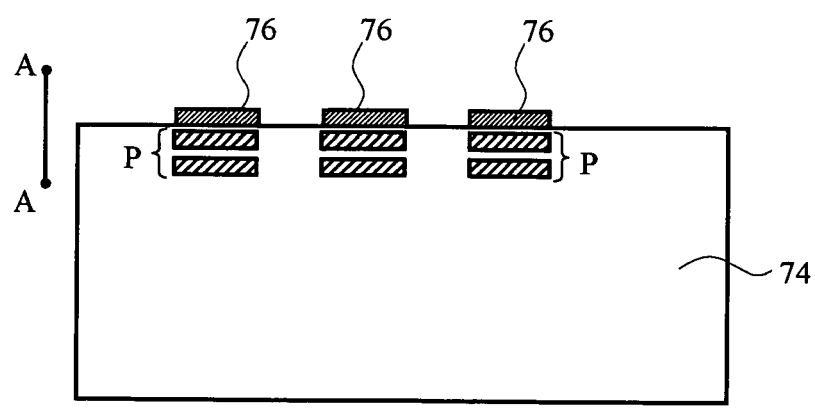
FIG. 20B shows the A—A line sectional view.

Moreover, as expressed in FIGS. 20A and 20B, the probe part P may be provided only in the either side of the pullout electrodes 76. That is, FIG. 20A shows a longitudinal section of the module, and FIG. 20B shows the A—A line sectional view.

In the case of the module illustrated in FIGS. 20A and 20B, the pullout electrodes 76 are provided in the vicinity of the end of the module. Therefore, the pullout electrodes 76 are placed outside of the gate substrate 74.

In such a case, the probe parts P may be placed on the one side of the pullout electrodes 76, without sandwiching them, as shown in FIGS. 20A and 20B. Even when the probe parts P are arranged in this way without inserting the conductors to be measured, detection of the current is also possible although the output obtained declines, as will be explained in full detail as an example of the invention later. Also in this case, the effect to cancel the influence of an external magnetic field is simultaneously maintained by preparing a pair of coil parts C.

Therefore, what is necessary is just to arrange the probe part P near the conductor to be measured, when it is difficult to locate the probe part P in the place to sandwich the conductor to be measured.

Figure 21:
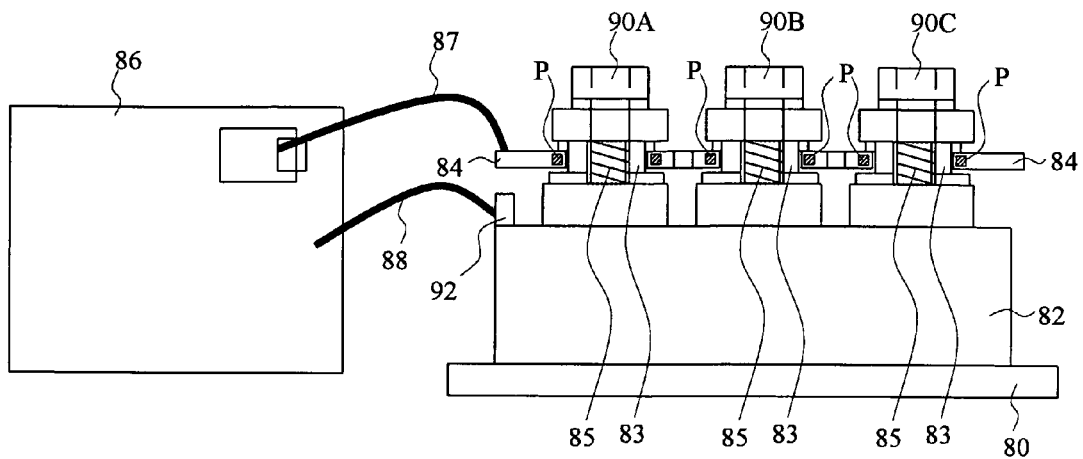
FIG. 21 is a schematic diagram showing another semiconductor device which includes the current detection equipment of the present invention.

FIG. 21 is a schematic diagram showing another semiconductor device which includes the current detection equipment of the present invention.

Figure 22:
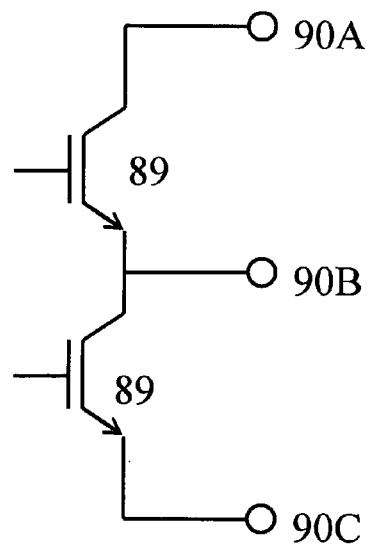
FIG. 22 is a schematic diagram showing the equivalent circuit of the element part.

And FIG. 22 is a schematic diagram showing the equivalent circuit of the element part.

That is, this example has a structure where two semiconductor elements 89 for electric power switching are connected in series, and terminals 90A, 90C, and 90B are taken out from the both ends and the connection middle point, respectively. These semiconductor elements 89 are packaged in the enclosure 82 formed on the substrate 80. And the main electrode terminals 90A–90C and the gate control terminal 92 are formed on it.

The main electrode terminals 90A–90C are installed in the place where electric power wiring can be connected to the bolts 85 for connection through the washer 83 which consists of copper etc. in the extraction part. And a substrate 84 is formed in the place which encloses the circumference of these washers 83, and the probe parts P of the current detection equipment of the invention are formed on this substrate.

The outputs from the probe parts P are drawn to the control substrate 86 through the connection wiring 87. The control substrate 86 has the integration circuit or amplification circuit for integrating or amplifying the output signals from the probe parts P, and a comparison circuit for comparing with a predetermined value. Moreover, the control substrate 86 may also have a gate drive circuit for controlling each of the semiconductor element 89 etc.

And the control signal from this gate drive circuit is inputted into the gate control terminal 92 through wiring 88.

Figure 23A:
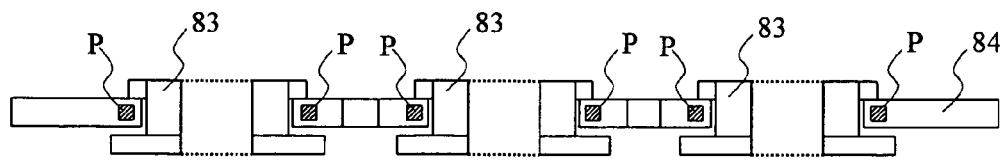
FIG. 23A shows a principal part sectional view near a substrate 84.
Figure 23B:
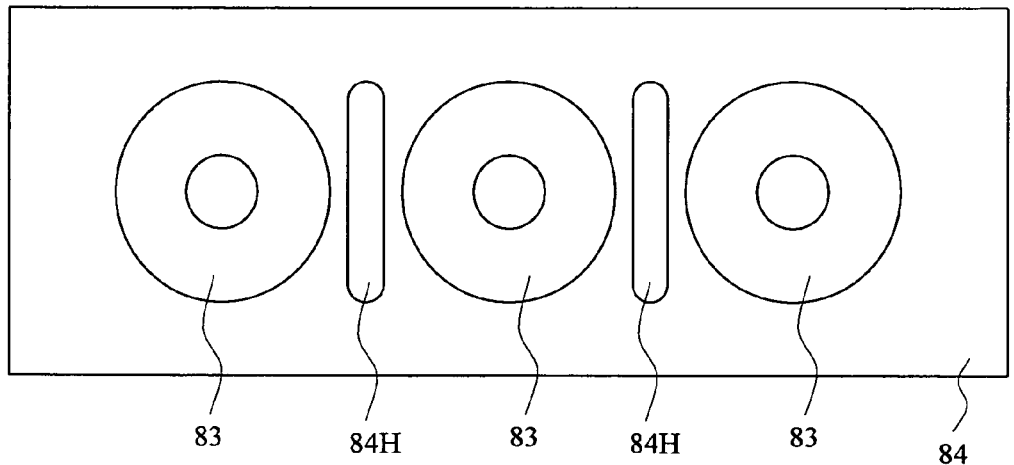
FIG. 23B shows a plane view seen from the back.

FIG. 23A shows a principal part sectional view near a substrate 84, and FIG. 23B shows a plane view seen from the back. The substrate 84 is formed of an insulating material and openings 84H for raising the breakdown voltage along its surface plane are prepared suitably.

The terminal current can be measured by placing the probe parts P which have a coil in the circumferences of the washers 83.

Figure 24A:
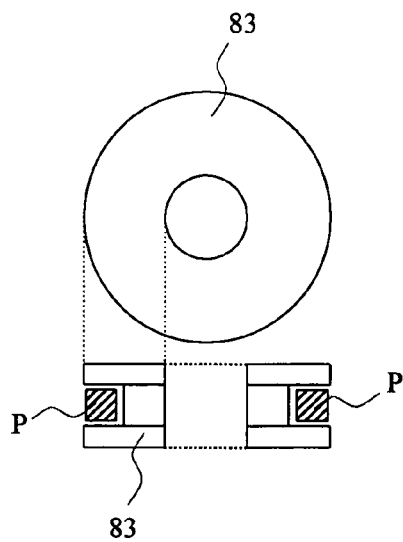
FIGS. 24A and 24B show the schematic sectional views of the examples of the probe part P.
Figure 24B:
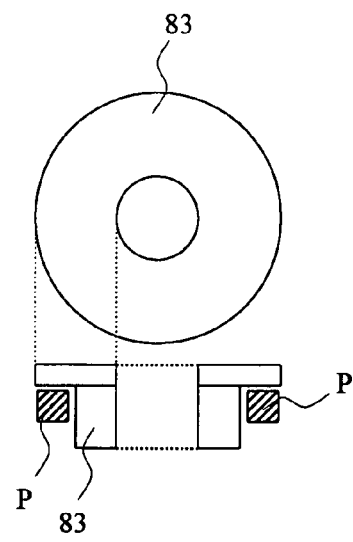

FIGS. 24A and 24B show the schematic sectional views of the examples of the probe part P.

That is, instead of forming the continuous substrate 84, as illustrated in FIGS. 24A and 24B, the probe parts P may be provided by forming the coil parts C in the substrates of a form which encloses only the circumference of a washer 83.

Figure 25:
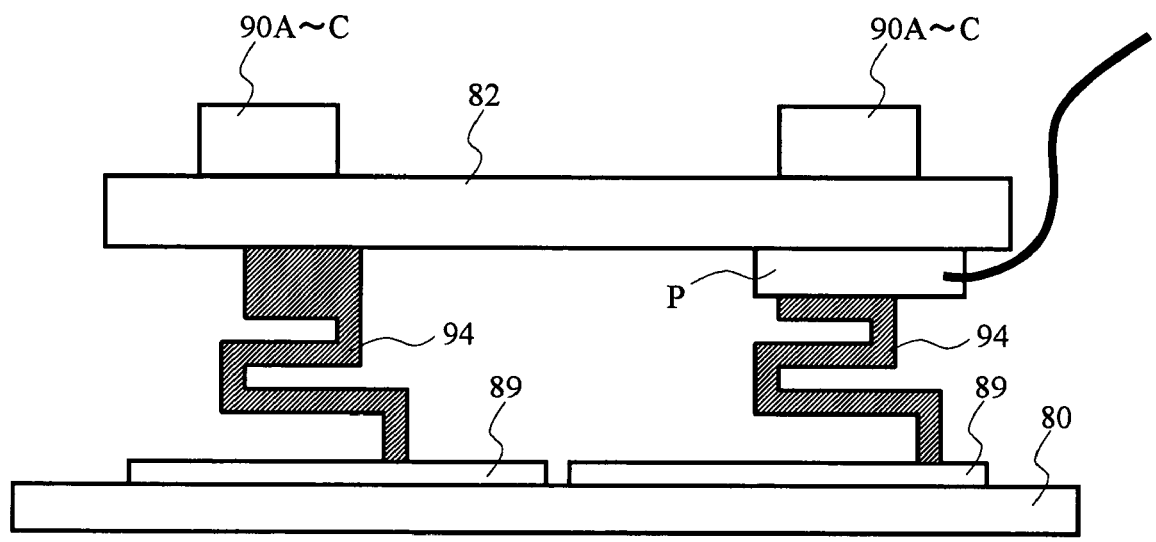
FIG. 25 is an internal enlargement showing the example of transformation of a semiconductor device expressed in FIG. 21.

FIG. 25 is an internal enlargement showing the example of transformation of a semiconductor device expressed in FIG. 21. That is, the connection wiring 94 connects the electrodes of the semiconductor elements 89 which are mounted on the substrate 80 (or DBC substrate etc.) and the main terminals 90A–90C.

As expressed in FIG. 25, the current can also be measured by placing the probe part P of the current detection equipment of the invention so as to sandwich the connection wiring 94.

In the above, the embodiments of the invention has been explained, referring to FIGS. 1A through 25.

Hereafter, the embodiments of the present invention will be explained in more detail, referring to examples.

FIRST EXAMPLE

First, the current detection equipment which measures the current which flows through the bonding wire connected to a semiconductor chip on a DBC substrate which was mentioned above about FIGS. 14A through 17 will be explained as a first example of the invention. That is, the probe part P for carrying out a real-time measurement of the current which flows through sixteen bonding wires (0.3 mmø) which consist of aluminum (Al) was studied.

Figure 26A:
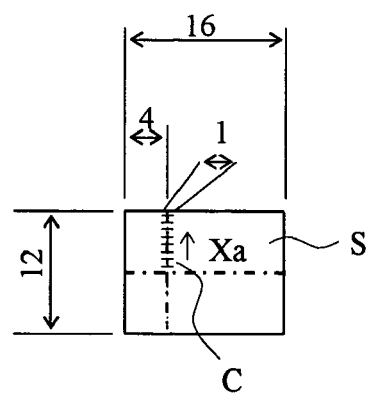
FIGS. 26A and 26B are conceptual figures showing an analysis model, where
Figure 26B:
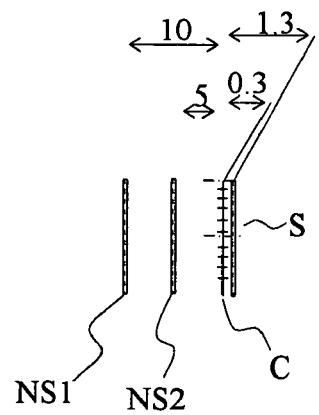

FIGS. 26A and 26B are conceptual figures showing an analysis model. That is, FIG. 26A is a plan view and FIG. 26B is a side view of the analysis model.

That is, sixteen aluminum bonding wires were approximated as the aluminum board S whose size is 12 mm×0.3 mm×16 mm so that the outermost form might become equal, and the copper wire coil C having a section of 1 mm$^2$ (1 mm×1 mm) was arranged in the interval pitch of 0.8 mm at the positions in a range of 0.8 mm through 1.3 mm from the aluminum board S.

Moreover, since the probe part P of the invention tends to received a noise from the magnetic flux by the current of the same direction as a bonding wire S, the noise sources 1 (NS1) and 2 (NS2) were arranged, and the influence of the external magnetic flux was also analyzed.

Table 1 summarizes the mutual inductance between the coil and the bonding wires taken from the center of the measured conductor, i.e., sixteen aluminum bonding wires.

TABLE 1

| Xa[mm] | 0.2 | 1.0 | 1.8 | 2.6 | 3.4 | 4.2 | 5.0 | 5.8 | Σ |
|---|---|---|---|---|---|---|---|---|---|
| M[nH] | 0.046 | 0.046 | 0.045 | 0.045 | 0.045 | 0.043 | 0.040 | 0.032 | → 0.342 |

Here, the resistance and the inductance of one turn of the coil C are 6.9 mohm and 1.92 nH (f=1 Hz), respectively. Table 1 shows the mutual inductance of the coil 1 turn and bonding wires in the distance Xa from a center.

Table 1 shows that when the coil pitch is 0.4 mm and the coil installed in the both sides of the bonding wires is 64 turns, the mutual inductance M=0.342×2×2×2=2.74 nH. In current change rate di/dt=100 A/μs, the open end voltage of 274 mV is obtained.

Next, the inventors have examined the mutual inductance of the coil and the noise source 1 (NS1).

Table 2 shows a mutual inductance between the coil and noise source 1 in the case where the noise source 1 is located from the bonding wires S in a distance of 10 mm.

TABLE 2

| Xa[mm]  | 0.2    | 1.0    | 1.8    | 2.6    | 3.4    | 4.2    | 5.0    | 5.8    |   | Σ      |
|---------|--------|--------|--------|--------|--------|--------|--------|--------|---|--------|
| MI1[nH] | −0.011 | −0.011 | −0.011 | −0.011 | −0.010 | −0.010 | −0.009 | −0.009 | → | −0.082 |
| MI2[nH] | 0.009  | 0.009  | 0.009  | 0.009  | 0.008  | 0.008  | 0.008  | 0.007  | → | 0.067  |
| MIS[nH] | −0.002 | −0.002 | −0.002 | −0.002 | −0.002 | −0.002 | −0.002 | −0.001 | → | −0.015 |

Further in this case the coil parts C were provided in both sides of the conductor S. In the table, the mutual inductance between the noise source 1 and the coil which is closer to the noise source is denoted by the symbol MI1. The mutual inductance between the noise source 1 and the coil which is remoter to the noise source is denoted by the symbol MI2. The sum of the mutual inductance MI1 and MI2 is denoted by the symbol MIS.

M=0.015 nH was obtained by providing the coil parts C in the both sides of the conductor S to be measured, and thereby canceling the influence of the external magnetic flux between these coil parts.

This mutual inductance is equivalent to about 4 percent of a signal level. Thus, there is little influence of the external current in the position distant 10 mm or more. Therefore, in an actual semiconductor device, it is thought that the influence from other electrode terminals etc. can be neglected.

Next, the inventors have examined the mutual inductance of the coils and the noise source 2 (NS2) when the coil parts C are provided in both sides of the conductor S.

Table 3 shows a mutual inductance between the coil and the noise source 2 in the case where the noise source 2 is located from the bonding wires S in the distance of 5 mm.

TABLE 3

| Xa[mm]  | 0.2    | 1.0    | 1.8    | 2.6    | 3.4    | 4.2    | 5.0    | 5.8    |   | Σ      |
|---------|--------|--------|--------|--------|--------|--------|--------|--------|---|--------|
| MI1[nH] | −0.025 | −0.025 | −0.024 | −0.023 | −0.022 | −0.021 | −0.019 | −0.016 | → | −0.175 |
| MI2[nH] | 0.019  | 0.019  | 0.018  | 0.018  | 0.017  | 0.016  | 0.015  | 0.013  | → | 0.134  |
| MIS[nH] | −0.006 | −0.006 | −0.006 | −0.006 | −0.005 | −0.005 | −0.004 | −0.003 | → | −0.041 |

In the table, the mutual inductance between the noise source 1 and the coil which is closer to the noise source is also denoted by the symbol MI1. The mutual inductance between the noise source 1 and the coil which is remoter to the noise source is denoted by the symbol MI2. The sum of the mutual inductance MI1 and MI2 is denoted by the symbol MIS.

Also in this case, M=0.041 nH was obtained by providing the coil parts C in the both sides of the conductor S to be measured, and thereby canceling the influence of the external magnetic flux between these coil parts. This mutual inductance is equivalent to about 12 percent of a signal level. Thus, it has some influences of current with a position of less than 10 mm from the bonding wires. Therefore, in an actual semiconductor device, the influence of the current which flows through the copper pattern near the chip may preferably be taken into consideration in some case.

However, the influence of current other than the current component which flows in the same direction as the bonding wires is small. Therefore, in the case of the DBC substrate mentioned above, it is thought that there is little influence is exerted by a copper pattern.

Next, the inventors have examined the mutual inductance when the position of coil C shifts up and down. Table 4 shows a mutual inductance when coil C shifts 0.1 mm towards the lower side.

TABLE 4

| Xa[mm]     | 0.2   | 1.0   | 1.8   | 2.6   | 3.4   | 4.2   | 5.0   | 5.8   |   | Σ     |
|------------|-------|-------|-------|-------|-------|-------|-------|-------|---|-------|
| upper[nH]  | 0.045 | 0.045 | 0.045 | 0.044 | 0.044 | 0.042 | 0.039 | 0.030 | → | 0.334 |
| lower[nH]  | 0.047 | 0.048 | 0.045 | 0.045 | 0.046 | 0.045 | 0.042 | 0.033 | → | 0.351 |

The average of the mutual inductance of the both sides of the bonding wires is M=0.342 nH. That is, it seems thst it is not necessary to consider the influence since it is compensated by the coils of both sides even if there is "a position error." When a coil shifts upwards, the items in the upper and lower columns in the Table 4 become reverse.

Next, the inventors have examined the mutual inductance at the time of changing the diameter of the coil. Table 5 shows the mutual inductance between the coil and the bonding wires at the time of enlarging the coil cross-section area, having used the diameter of the coil as 2 mm×1 mm.

Table 5 shows that in the case where the coils (64 turns) are installed in the both sides of the bonding wires with the coil pitch of 0.4 mm, the mutual inductance is M=0.684× 2×2×2=5.47 nH. That is, if current change rate di/dt=100 A/μs, then the open end voltage of 547 mV are obtained.

TABLE 5

| Xa[mm] | 0.2 | 1.0 | 1.8 | 2.6 | 3.4 | 4.2 | 5.0 | 5.8 | | Σ |
|---|---|---|---|---|---|---|---|---|---|---|
| M[nH] | 0.093 | 0.092 | 0.090 | 0.089 | 0.090 | 0.087 | 0.080 | 0.063 | → | 0.684 |

The first example explained above can be summarized as the following:

That is, if the current change rate is 15 A/μs, the open end voltage will become 82 mV when the cross-section area of the coil is 2 mm² (2 mm×1 mm) and the coil has 64 turns. In the case of a trial production coil form, by setting the cross-section area of the trial production coil to 3.92 mm² (inner diameter:2.45 mm×1.6 mm) and by setting the turn number to 48, about 1.47 times as much output will be obtained, and the open end voltage of 120 mV will be obtained.

It is thought that 10-ohm terminal voltage at the time of actual measurement will become about 105 mV if the inside resistance of the coil is 1.47 ohms. This example is the analysis where the bonding wires are approximated by the aluminum board S. It turned out that the output voltage of the almost same order as 80 mVp of the measurement result obtained in the second example explained in full detail behind is obtained. As long as the gain of the integration circuit, and the noise of transmission from the coil to the integration circuit are low enough, a resistance of about 1 ohm will be sufficient for the terminus resistance.

That is, from the result of the analysis, it has also been confirmed that the current detection equipment of the invention can be used as a chip current sensor.

SECOND EXAMPLE

Next, based on the analysis of the first example mentioned above, concrete current detection equipment was made as a second example of the invention, and the performance was evaluated. In this example, the inventors have tried to measure the chip current in the conventional module, without changing the bonding wires and the modular structure. Specifically, a structure where the probe part can sandwich the bonding wires from the circumference was employed. Moreover, wires were not wound around a substrate but the coil parts were realized by using the multilayered printed circuit board in which the patterns were formed. Thus, reproducibility of the measurement can be secured even if the total size of the semiconductor device is miniaturized.

Figure 27:
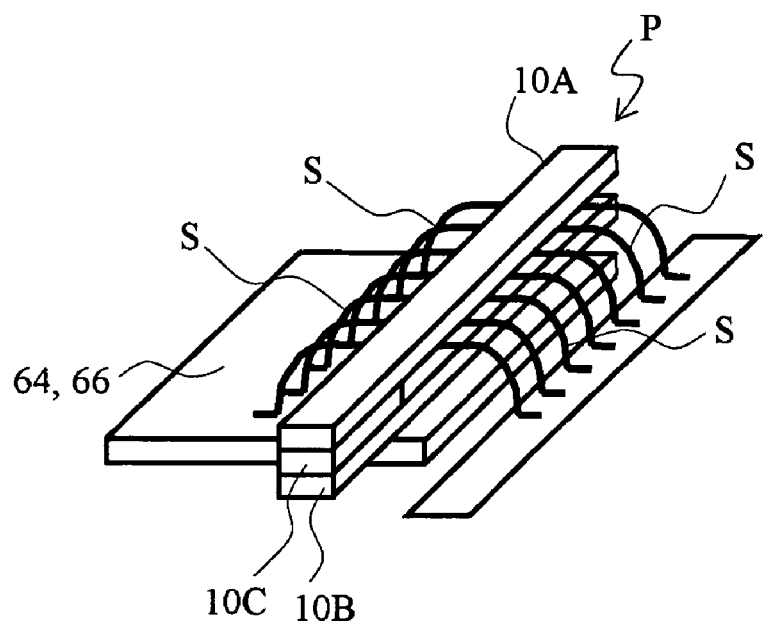
FIG. 27 is a schematic diagram showing the probe part of the current detection equipment fabricated in this example.

FIG. 27 is a schematic diagram showing the probe part of the current detection equipment fabricated in this example. That is, this probe part P has similar structure to what was mentioned above about FIGS. 14A through 17.

Figure 28:
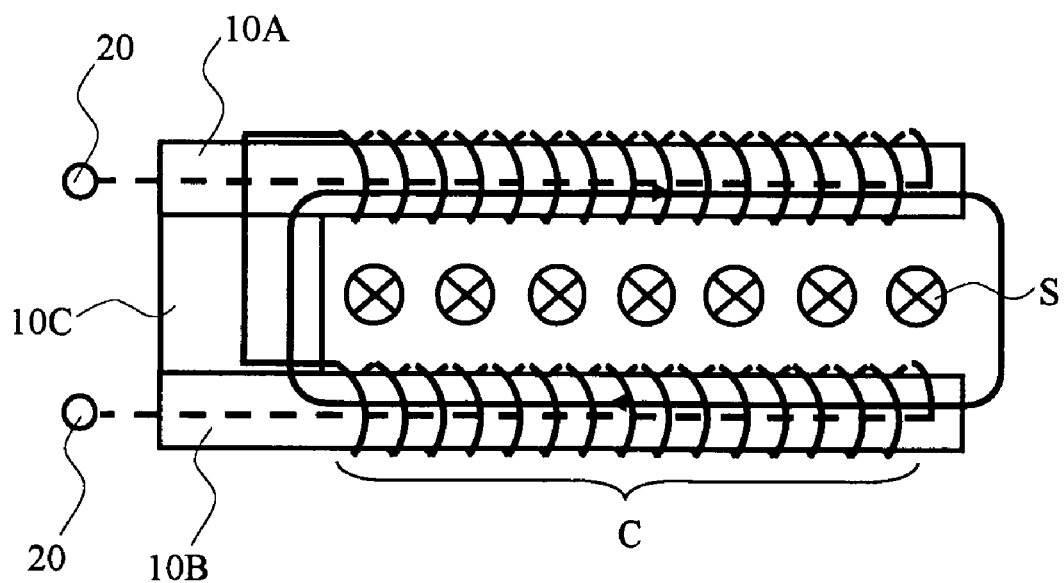
FIG. 28 is a schematic diagram showing the coil section of a probe part.

FIG. 28 is a schematic diagram showing the coil section of a probe part. These coils are connected so that the electromotive powers which are induced in the upper and lower coil parts C may be added. Since a magnetic flux is generated by the current which flows through the bonding wire S, the coil detects this magnetic flux and the voltage corresponding to the current is induced at a coil.

FIGS. 29A through 29C are schematic diagrams showing the more concrete structure of the probe part P. FIG. 29A shows a plan view, FIG. 29B shows a front view, and FIG. 29C shows a side view.

Here, the three-layered printed circuit board is used as the substrates 10A and 10B. The coil is formed by the patterns 12 of the both sides of the substrate and the through holes 14. The end of the coil is connected to the inner layer of the substrate 10A, and it is connected to the beginning of the coil of the substrate 10B. Connection of the upper and lower substrates 10A and 10B is made by the sandwiched spacer 10C. Here, by laminating the coil substrates 10A and 10B of the same structure, the common phase rejection ratio against the noise by the external magnetic flux can be improved, and the influence of voltage increasing rate dv/dt generated at the time of current interception can be decreased. A termination resistance (not shown) is connected to the patterns (PTR)

Size of the substrates 10A and 10B of a probe part was made into a width of 3.5 mm×length of 20 mm by taking the number and pitch of the bonding wires which should be measured into consideration. Moreover, the length of the insertion part containing the bonding wires was made to 15 mm.

Moreover, substrate thickness (coil thickness) was set to 1.6 mm so that a coil cross-section area might be enlarged and large output voltage might be obtained. Consequently, the cross-section area of the coil was set to approximately 3 mm×1.6 mm. On the other hand, although the output voltage decreases, the probe of 1 mm of basis board thickness (coil thickness) was also fabricated so that a measurement might be possible also in a narrower space.

Thickness of spacer 10C was set to 0.6 mm, in order to insert a bonding wire of 0.3 mmø and to make the detection sensitivity not fall. The upper and lower substrates 10A and 10B were pasted up through the spacer 10C, and were connected by soldering the wire 18 which penetrated through the spacer 10C.

Moreover, in order to measure not only a bonding wires but the current of the power bus (t=1 mm) in a module which was shown in FIG. 18, the probe where the thickness of the spacer 10C was 1.6 mm was also fabricated.

Thus, when the fabricated probe part of the example is compared with the conventional CT probe, weight was about 1/60 and volume was 1/22 . That is, it turned out that a weight saving and a miniaturization can be attained sharply.

Figure 30A:
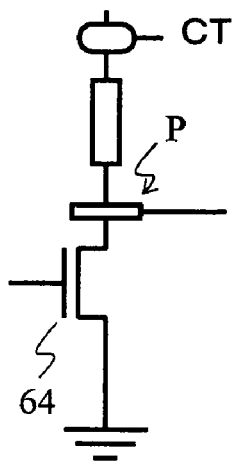
FIG. 30A shows the experimental setup.
Figure 30B:
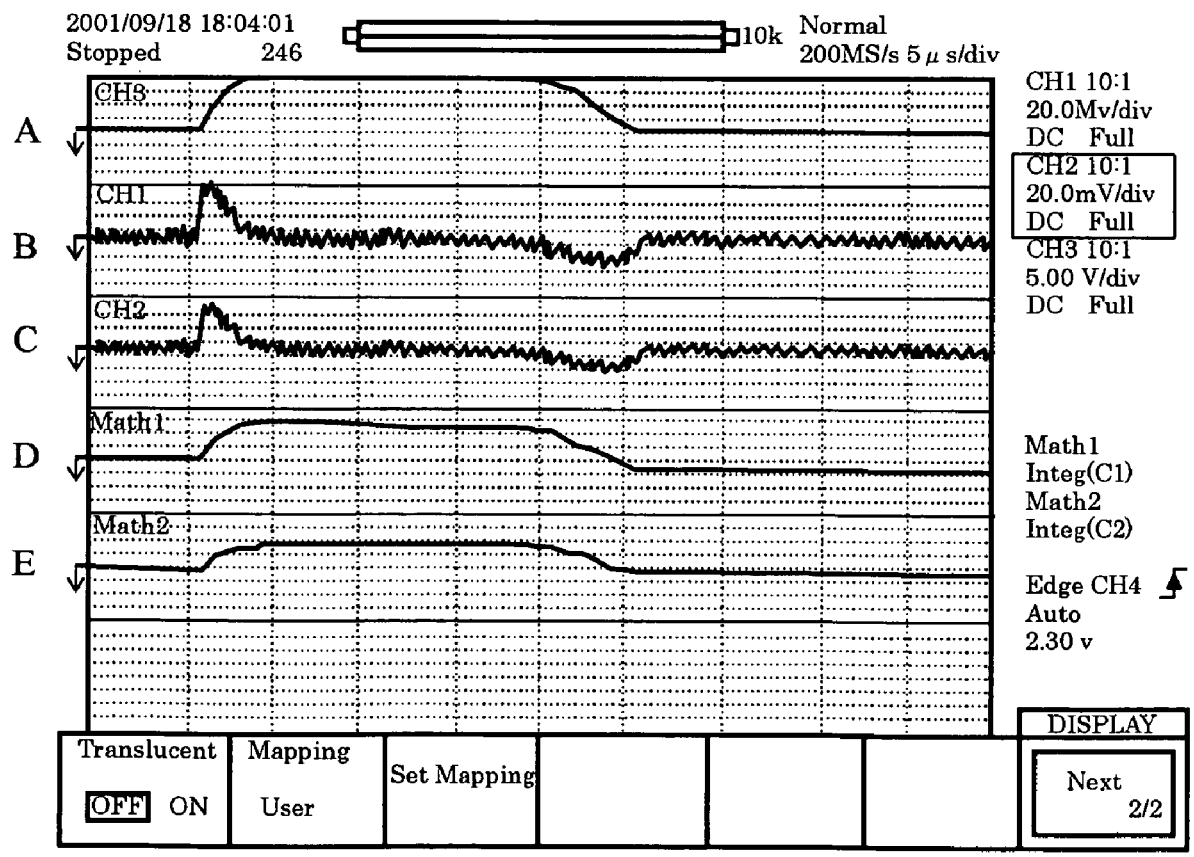
FIG. 30B is a graphical representation showing the waveform when inserting a copper plate in a probe part and passing pulse current.

FIG. 30A shows the experimental setup. FIG. 30B is a graphical representation showing the waveform when inserting a copper plate in a probe part and passing pulse current. That is, the characteristic A shows the current value measured with the conventional CT type probe, B shows the output waveform from the probe part of the invention where the oil thickness was set to 1.6 mm, C shows the output waveform from the probe part of the invention where the coil thickness was set to 1 mm, and D and E show the waveforms which were obtained by the integration processing of the waveform of B and C, respectively.

As shown in FIG. 30B, also when the probe part of the invention is used, the same current waveform as the conventional CT type probe can be reproduced. Moreover, the difference in the coil cross-section area produced here by the difference in the coil thickness of 1 mm (C and E) and 1.6 mm (B and D) has induced the difference of 1.6 times the output voltage. Since the current rate of change was as slow as the di/dt=15 A/μs, output voltage was 80 mVp.

Next, the inventors have investigated about change of the output voltage by the position relation of the conductor S and the probe part P.

Figure 31:
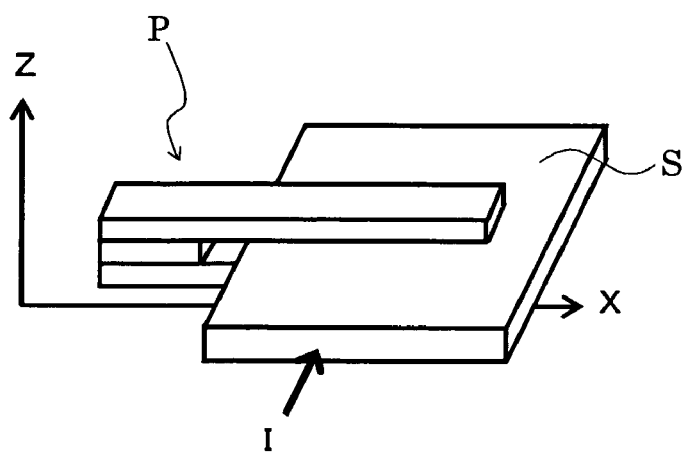
FIG. 31 is a schematic diagram showing this measuring method.

FIG. 31 is a schematic diagram showing this measuring method. Here, the copper plate of width 15 mm×0.5 mmt was used as a conductor S through which the current I flows. Differentiation output voltage was measured while changing the position relation between the conductor S and the probe part P as follows:

(1) With regard to the direction of the x-axis, the position where the probe part P was inserted conductor S the deepest was set to 0 mm, and while pulling out the conductor S gradually, the relation of the position and the output voltage was measured.

(2) With regard to the direction of the Z-axis, the position where the conductor S was inserted in the center of the interval of the probe part P was set to a standard (0 mm), and the differentiation output voltage was measured while making the conductor S move to upward from the standard position.

Figure 32:
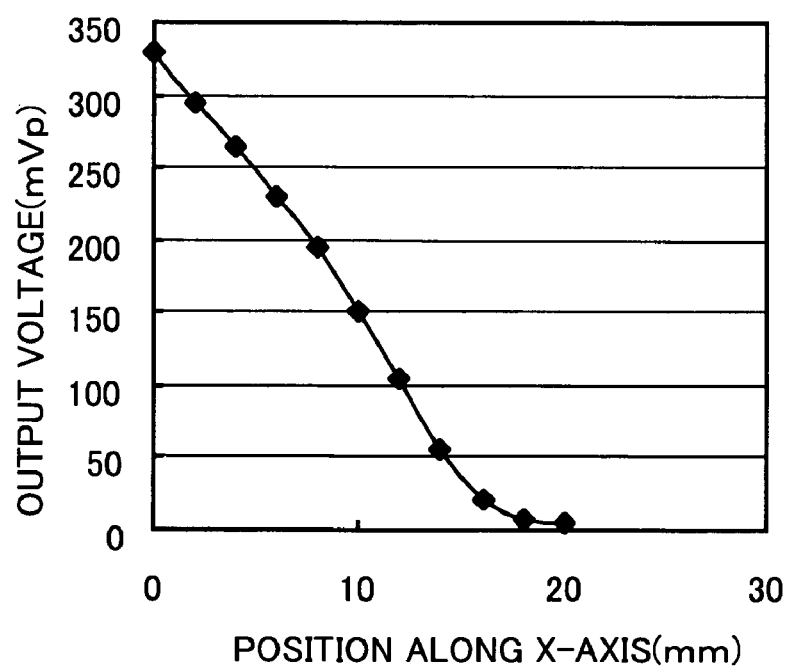
FIGS. 32 and 33 are graphical representations showing these measurement results.
Figure 33:
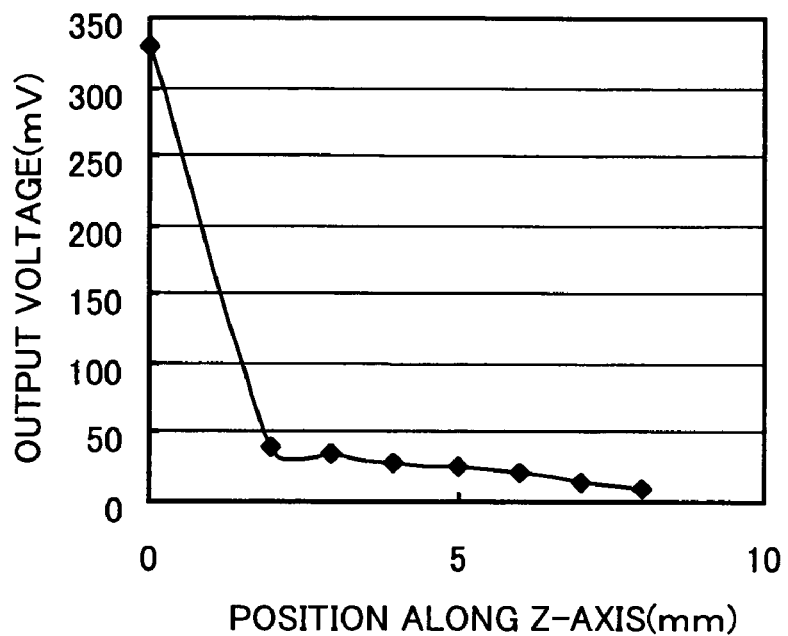

FIGS. 32 and 33 are graphical representations showing these measurement results. Here, the measurement position in the horizontal axis expresses the interval of the center of the probe part P, and the upper part of the conductor S.

About the direction of the X-axis, as expressed in FIG. 32, the output voltage in the position (X=0) which the probe part P inserted in conductor S most deeply is the maximum, and the output voltage is decreasing almost linearly as the conductor S separates from the probe part P. In the positions where the conductor S separates 3 mm or more from the opening end of the probe part P, output voltage decreases down to about 2.4 percent.

On the other hand, as for the direction of the Z-axis, if the position becomes 2 mm or more, output voltage will fall almost by an order, as expressed in FIG. 33. Here, that the position of the conductor S is 2 mm or more means that the conductor S is provided in the outside rather than that is inserted into the gap of the substrates 10A and 10C of the probe part P. That is, a position relation which was illustrated in FIGS. 20A and 20B is formed. Thus, although the output declines, measurement of the current is possible, even when the conductor S is placed in the side of the probe part P, without being inserted into the probe part P.

Figure 34:
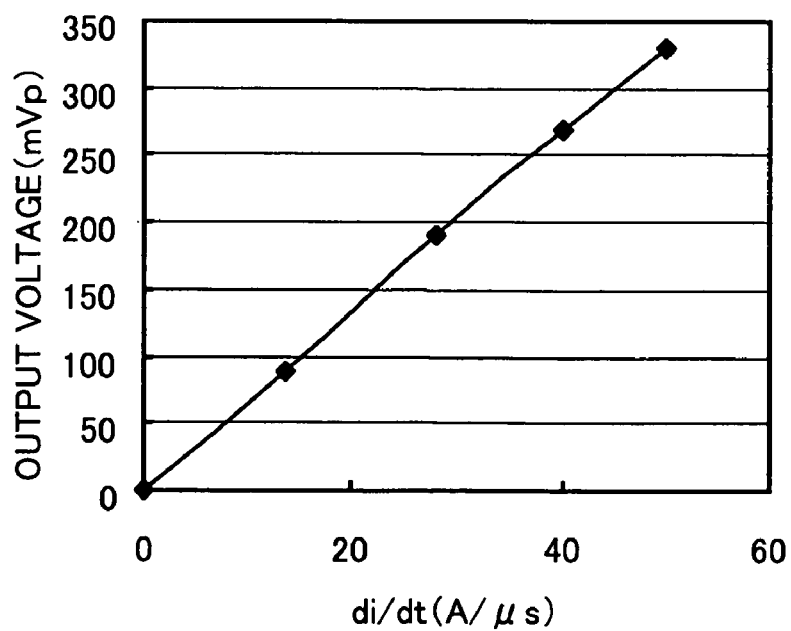
FIG. 34. is a graphical representation showing the relation between current change rate di/dt and output voltage.

FIG. 34 is a graphical representation showing the relation between current change rate di/dt and output voltage. Here, the current change rate di/dt was measured up to 50 A/µs. As a result, it turned out that the current change rate and the output voltage were maintaining the linear relation mostly, and thus, a high measurement of accuracy could be obtained.

Figure 35:
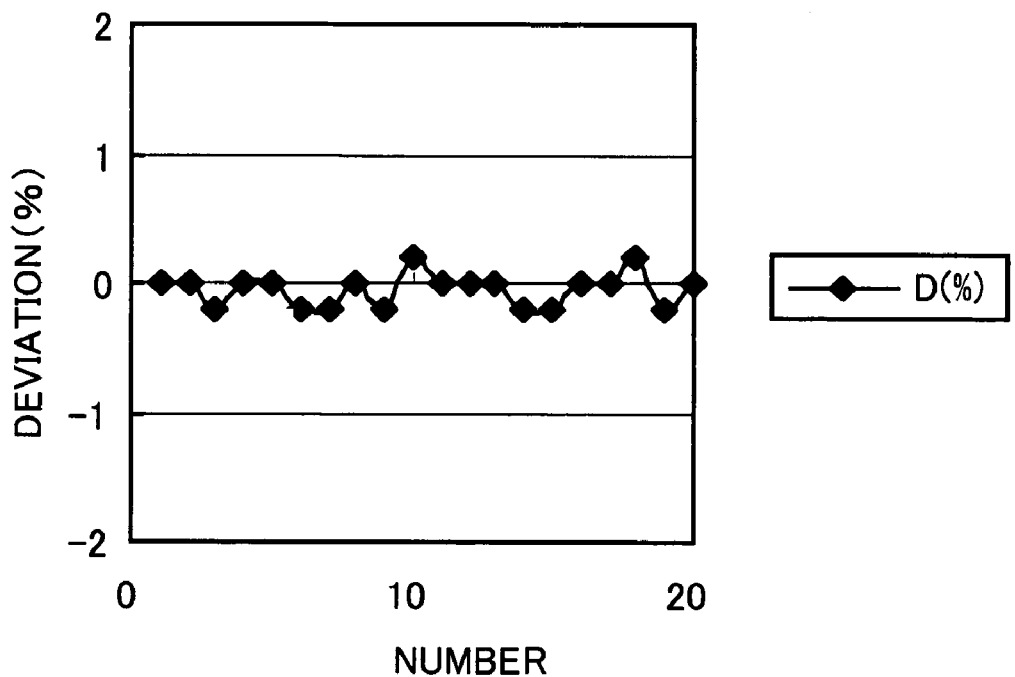
FIG. 35 is a graphical representation showing the distribution of the relative measurement accuracy of two or more probe parts.

FIG. 35 is a graphical representation showing the distribution of the relative measurement accuracy of two or more probe parts. 20 probes parts were made as an experiment, and those differentiation output voltages were measured. As a result, the relative accuracy in the probe in the same conditions is less than plus-or-minus 1 percent, and it became clear that the reproducibility of sensitivity is very good.

In this example, the coaxial cable was used as a lead from the probe part P so that a lead might not be affected, even if big voltage change rate dv/dt occurred at the time of current interception. As a coaxial cable, a super thin coaxial cable was used whose tip size was 0.65 mmø so that stress might not be given to the bonding wire used as the measured body when the probe part P moved. This super thin coaxial cable was connected to the 1.5 D-2V coaxial cable on the way, then connected with the BNC connector. Moreover, in order to suppress vibration, the termination was carried out by 10-ohm resistance for one coil.

Next, the current which flew a semiconductor element was measured by carrying the probe part P in the module for electric power control, as expressed in FIGS. 14A through 17. The output waveform from them was observed by adding the probe parts P to four DBC substrates of the 4.5 kV-600 A module which consists of 16 semiconductor chips.

Since the output signal from the probe part P is differentiation output voltage, an original current waveform can be reconstructed by using an integration circuit.

Figure 36:
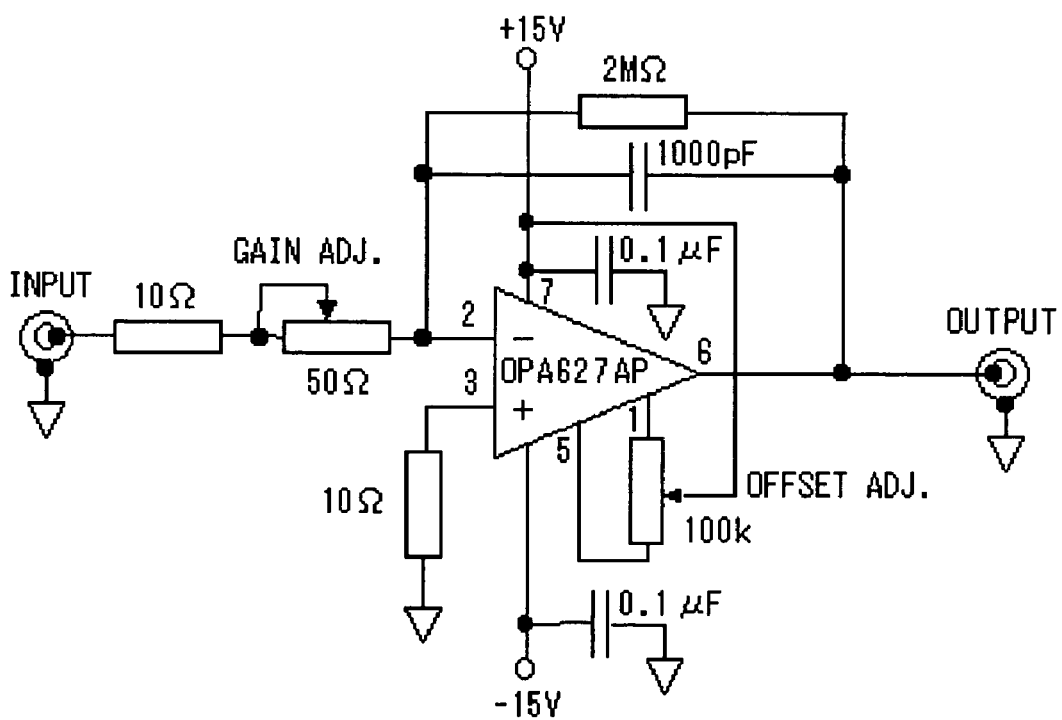
FIG. 36 is a circuit diagram showing the principal part of the integration circuit used in this example.

FIG. 36 is a circuit diagram showing the principal part of the integration circuit used in this example. This integration circuit performs an imperfect integration using the OP amplifier. As the OP amplifier, the amplifier of the type of an FET input type and a low drift broadband was adopted.

Figure 37:
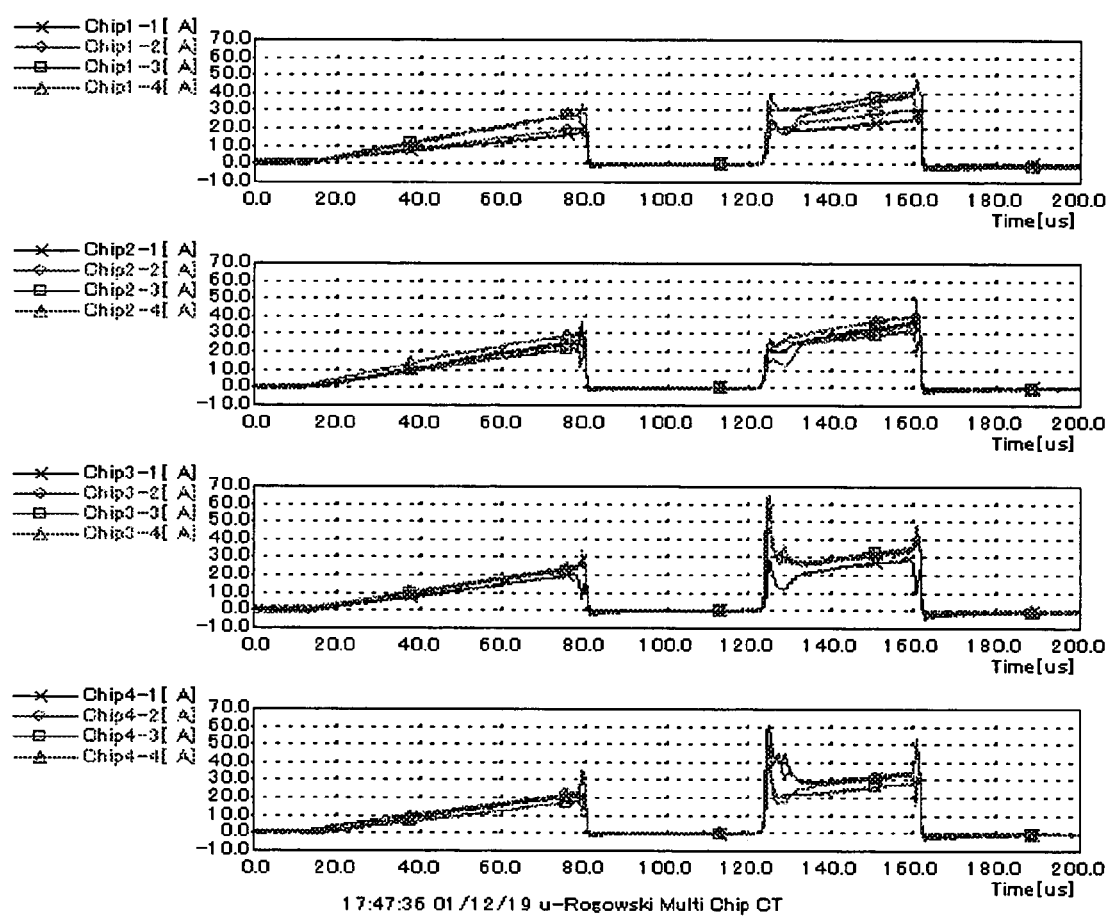
FIG. 37 is a graphical representation showing the waveform which observed the current of 16 semiconductor chips.

FIG. 37 is a graphical representation showing the waveform which observed the current of 16 semiconductor chips.

Figure 38A:
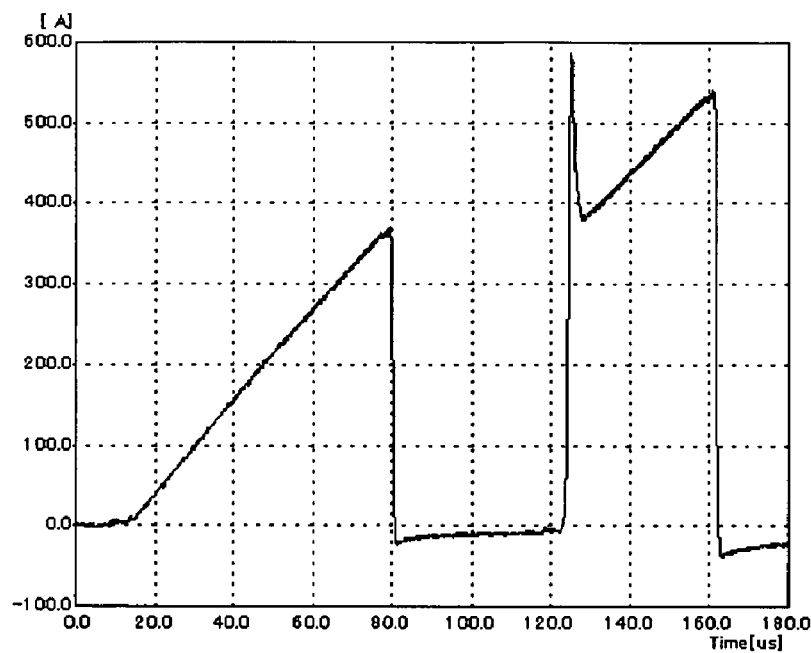
FIG. 38A expresses the waveform adding the current measurement data of 16 chips measured by the probe part of the invention.
Figure 38B:
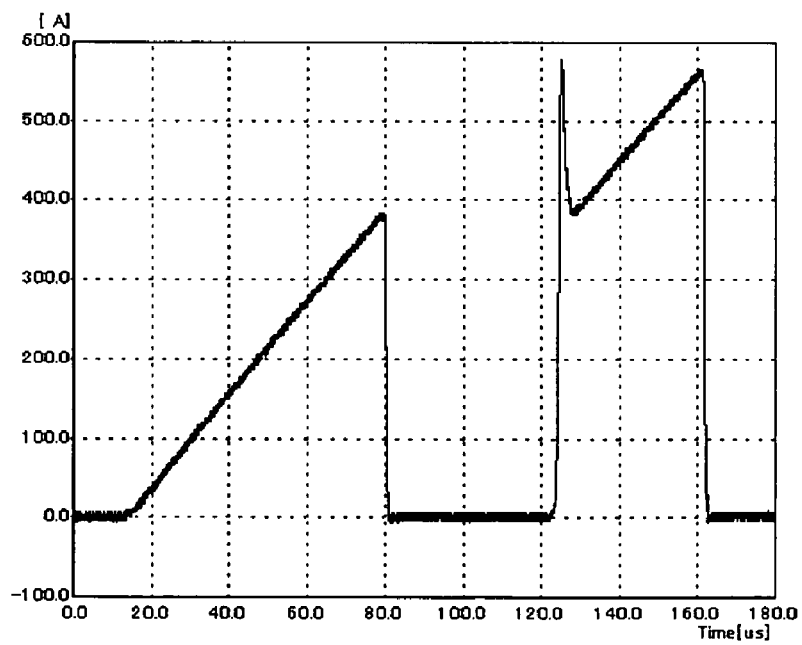
FIG. 38B is a graphical representation showing the main current waveform measured with the conventional CT type probe.

FIG. 38A expresses the waveform adding the current measurement data of 16 chips measured by the probe part of the invention, and FIG. 38B is a graphical representation showing the main current waveform measured with the conventional CT type probe.

From these results, it is understood that by using the probe part of the present invention, the current measurement is successful and the same current waveform as the conventional CT type probe is obtained for all the 16 semiconductor chips.

As mentioned above, as explained in full detail, in this example, it turned out that the probe part included in the bonding wire of 16 chips, all the addition current waveforms obtained with the integration vessel and the main current waveform measured with the conventional CT type probe are almost equivalent.

In the case where the current change rate di/dt=50 A/µs, differentiation output voltage is 330 mVp (terminated at 10 ohms to each coil). Therefore, under the actual use condition where the current change rate di/dt=100 A/µs or more, the output voltage becomes about 1 Vp. This voltage level is considered to be enough as a signal output.

Moreover, the variation in the relative sensitivities of the probe parts P is less than plus-or-minus 1 percent under the same conditions, and thus, very good reproducibility was obtained. Also about the influence of a wire frame, when separated from the basic characteristic about 10 mm, the data which falls to 5 percent or less was obtained, and influence was not seen by this evaluation, either. It was checked that the current of a chip is measurable including in a module, since it was such.

Although the preferred embodiment of the present invention has been described heretofore, referring to its examples, it is not intended that the invention should be limited to those examples.

Configuration, size, shape, materials, arrangement of each component of the current detection equipment and the semiconductor device may be appropriately modified by any person skilled in the art, and it will be appreciated that such modifications should all be included in the scope of the present invention.

For example, the product which includes a protective film etc. over the substrate so that the conductive patterns which consist the coil may not expose is also included within the range of the invention.

Moreover, the product where the coil is embedded inside is also included within the range of the invention by laminating another substrate etc. on the substrate on which the coil is formed.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
a semiconductor element having a gate terminal;
a current detection equipment including;
a substrate,
a first coil and a second coil provided on the substrate, and
a resistance;
a first circuit connected to the current detection equipment;
a second circuit connected to the gate terminal;
each of the first and second coils having first conductive patterns provided on a surface of the substrate, second conductive patterns provided on a back of the substrate and connecting parts which connect the first and second conductive patterns;
the first coil and the second coil being connected in series, and the resistance connected in parallel to the first and second coils;
at least a part of a current flowing in the semiconductor element being detected by the current detection equipment; and
the second circuit providing a signal to the gate terminal based on a signal outputted from the first circuit.

2. A semiconductor device according to claim 1, wherein the first and second coils are connected so that a voltage induced by a magnetic flux generated by the current flowing through the object in the first coil and a voltage induced by the magnetic flux generated by the current flowing through the object in the second coil are added.

3. A semiconductor device according to claim 1, wherein each of the connecting parts has a conductor which penetrates the substrate.

4. A semiconductor device according to claim 1, wherein each of the connecting parts has a conductive pattern provided on a side surface of the substrate.

5. A semiconductor device according to claim 1, wherein at least a part of a wiring which connects the first and second coils extends inside the substrate.

6. A semiconductor device according to claim 1, wherein the first circuit includes an integration circuit.

7. A semiconductor device according to claim 6, wherein the first circuit further includes an offset cancellation circuit which compensates an offset included in a inputted current waveform signal.

8. A semiconductor device according to claim 1, wherein the first circuit includes a comparison circuit which outputs a short circuit signal to the second circuit when the detected current exceeds a predetermined restriction current value, and the second circuit outputs an interception gate signal to the gate terminal.

9. A semiconductor device according to claim 1, wherein the first circuit includes an amplification circuit which amplifies a current differentiation value outputted from the current detection equipment.

10. A semiconductor device according to claim 1, wherein the second circuit outputs a status signal indicating a state of the gate of the semiconductor element to the first circuit.

11. A semiconductor device according to claim 1, wherein the semiconductor element is a power MOSFET.

12. A semiconductor device according to claim 1, wherein the semiconductor element is an IGBT.

13. A semiconductor device according to claim 1, wherein the substrate has a notch or a hole, and the first coil and the second coil are provided on opposite sides of the notch or the hole.

14. A semiconductor device comprising:
a semiconductor element having a gate terminal;
a current detection equipment including,
a first substrate having a first coil,
a second substrate having a second coil,
a spacer provided between the first and second substrates,
the first coil having first conductive patterns provided on a surface of the first substrate, a second conductive patterns provided on a back of the first substrate and connecting parts which connect the first and second conductive patterns,
the second coil having first conductive patterns provided on a surface of the second substrate, a second conductive patterns provided on a back of the second substrate and connecting parts which connect the first and second conductive patterns, and
a resistance;
a first circuit connected to the current detection equipment; and
a second circuit connected to the gate terminal, the first coil and the second coil being connected in series, and the resistance connected in parallel to the first and second coils;
at least a part of a current flowing in the semiconductor element being detected at the spacer by the current detection equipment; and
the second circuit providing a signal to the gate terminal based on a signal outputted from the first circuit.

15. A semiconductor device according to claim 14, wherein the first circuit includes an integration circuit.

16. A semiconductor device according to claim 15, wherein the first circuit further includes an offset cancellation circuit which compensates an offset included in a inputted current waveform signal.

17. A semiconductor device according to claim 15, wherein the first circuit further includes a comparison circuit which outputs a short circuit signal to the second circuit when the detected current exceeds a predetermined restriction current value, and the second circuit outputs an interception gate signal to the gate terminal.

* * * * *